(12) United States Patent
Suwa et al.

(10) Patent No.: US 6,187,504 B1
(45) Date of Patent: *Feb. 13, 2001

(54) RADIATION SENSITIVE RESIN COMPOSITION

(75) Inventors: Mitsuhito Suwa; Haruo Iwasawa; Toru Kajita; Shin-ichiro Iwanaga, all of Mie (JP)

(73) Assignee: JSR Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 08/976,662

(22) Filed: Nov. 24, 1997

(30) Foreign Application Priority Data

Dec. 19, 1996 (JP) .................................................. 8-353866

(51) Int. Cl.$^7$ ...................................................... G03F 7/004
(52) U.S. Cl. ...................... 430/270.1; 430/914; 430/921
(58) Field of Search .................................. 430/326, 914, 430/921, 270.1

(56) References Cited

U.S. PATENT DOCUMENTS

| | | | |
|---|---|---|---|
| 4,118,297 | * 10/1978 | Broxterman et al. | 204/159.11 |
| 5,191,124 | * 3/1993 | Schwalm et al. | 568/18 |
| 5,612,450 | 3/1997 | Mizushima et al. | 528/353 |
| 5,693,452 | * 12/1997 | Aoai et al. | 430/270.1 |
| 5,962,180 | * 10/1999 | Iwanaga et al. | 430/170 |

FOREIGN PATENT DOCUMENTS

| | | |
|---|---|---|
| 4035425 | 5/1991 | (DE) . |
| 0380010 | 8/1990 | (EP) . |
| 0413087 | 2/1991 | (EP) . |
| 0793144 | 9/1997 | (EP) . |
| 5-297591 | * 7/1993 | (JP) . |

OTHER PUBLICATIONS

English Translation of JP 5–297561, 1993.*

* cited by examiner

*Primary Examiner*—Janet Baxter
*Assistant Examiner*—Rosemary Ashton
(74) *Attorney, Agent, or Firm*—Oblon, Spivak, McClelland, Maier & Neustadt, P.C.

(57) ABSTRACT

A positive-tone or negative-tone radiation sensitive resin composition comprising (A) a photoacid generator represented by the following formula (1-1) or (1-2):

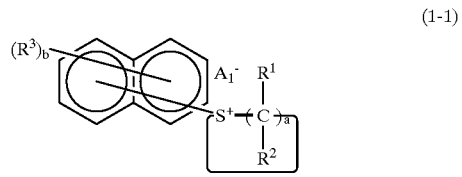

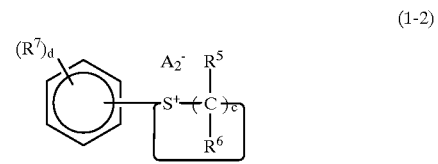

wherein $R^1$, $R^2$, $R^5$, and $R^6$ are an alkyl group, $R^3$ and $R^7$ are a hydroxyl group or —$OR^4$ (wherein $R^4$ is an organic group), $A_1^-$ and $A_2^-$ indicate a monovalent anion, a and c denote an integer of 4–7, and b and d an integer of 0–7. The positive-tone resin composition further comprises (B1) an acid-cleavable group-containing resin or (B2) an alkali-soluble resin and an alkali solubility control agent, and the negative-tone radiation sensitive resin composition further comprises (C) an alkali-soluble resin and (D) a crosslinking agent. The resin compositions are highly sensitive and exhibit superior resolution and pattern forming performance.

11 Claims, No Drawings

RADIATION SENSITIVE RESIN COMPOSITION

BACKGROUND OF THE INVENTION

1. Field of the Invention

The present invention relates to a positive-tone or negative-tone radiation sensitive resin composition which contains a specific photoacid generator and is useful as a resist suitable for use in precision machining utilizing various types of radiation such as ultraviolet light, deep ultraviolet light, X-rays, or charged particle rays.

2. Description of the Background Art

There is an increasing demand for miniaturization, requiring reduced processing sizes in lithography, in fields requiring fine work such as manufacture of integrated circuits (ICs) in order to achieve high integrity in ICs. Technologies capable of fine processing, even of a size of 0.5 mm or smaller, in a stable manner have become necessary in recent years. Because of this, resists used in such a technology must be capable of forming patterns smaller than 0.5 mm at high precision. It is extremely difficult to produce a minute pattern smaller than 0.5 mm at a high precision by conventional methods using visible light (wavelength 800–400 nm) or near ultraviolet light (wavelength 400–300 nm) Because of this, the use of short wavelength radiation (wavelength 300 nm or less) has been studied.

Given as examples of such a short wavelength radiation are deep ultraviolet rays, such as a bright line spectrum of a mercury lamp (wavelength 254 nm), a KrF excimer laser (wavelength 248 nm), and an ArF excimer laser (wavelength 193 nm); X-rays such as synchrotron radiation; and charged particle rays such as an electron beam. Lithography using an excimer laser among these is attracting a great attention due to its high output and high efficiency. For this reason, the resists used in lithography also must produce minute patterns of 0.5 mm or less with high sensitivity and high resolution by excimer laser with good reproducibility.

A chemically amplified resist using a radiation sensitive acid generator which generates an acid by being exposed to radiation (hereinafter referred to as "exposure") and in which the sensitivity of resist is increased by the catalytic action of the acid has been proposed as a resist applicable for use with deep ultraviolet light such as from an excimer laser.

As examples of such chemically amplified resists, a combination of a resin protected by a t-butyl group or t-butoxy carbonyl group and a photoacid generator is disclosed in Japanese Patent Application Laid-open No. 45439/1984. Japanese Patent Application Laid-open No.52845/1985 discloses a combination of a resin protected by a silyl group and a photoacid generator. Beside these, there are many reports relating to chemically amplified resists such as, for example, a resist which contains a resin having an acetal group and a photoacid generator (Japanese Patent Application Laid-open No. 25850/1990).

Given as examples of the photoacid generator used in these chemically amplified resists are onium salts, such as triphenylsulfonium trifluoromethanesulfonate, triphenylsulfonium hexafluoroantimonate, triphenylsulfonium naphthalenesulfonate, cyclohexylmethyl(2-oxocyclohexyl) sulfonium trifluoromethanesulfonate; sulfonate of 2,6-dinitrobenzyl, tris(methanesulfonyloxy)benzene, and bis(cyclohexylsulfonyl)diazomethane. These conventional photoacid generators are generally unsatisfactory in their sensitivity. Some photoacid generators have relatively high sensitivity, but their overall resist performance, such as resolution and pattern configuration, is not necessarily sufficient.

In view of this situation, there has been a stong desire for the development of a photoacid generator exhibiting high sensitivity and high resolution, and capable of producing fine pattern configuration.

An object of the present invention is therefore to provide a positive tone or negative tone radiation sensitive resin composition capable of producing a superior resist pattern with high sensitivity, high resolution, excellent pattern configuration.

SUMMARY OF THE INVENTION

This object can be achieved in the present invention by a positive-tone radiation sensitive resin composition comprising:

(A) a photoacid generator represented by the following formula (1-1):

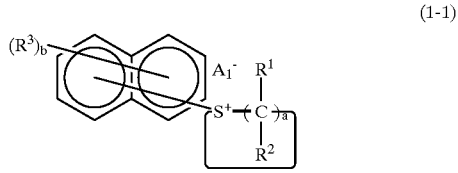

wherein $R^1$ and $R^2$ may be either same or different and each individually represents an alkyl group containing 1–4 carbon atoms, $R^3$ represents a hydroxyl group or —$OR^4$ (wherein $R^4$ is an organic group having 1–6 carbon atoms), $A_1^-$ indicates a monovalent anion, a denotes an integer of 4–7, and b is an integer of 0–7; or formula (1-2):

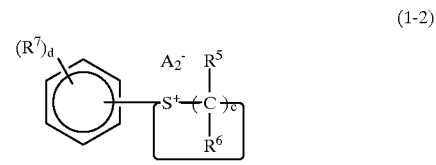

wherein $R^5$ and $R^6$ may be either same or different and each individually represents an alkyl group containing 1–4 carbon atoms, $R^7$ represents a hydroxyl group or —$OR^8$ (wherein $R^8$ is an organic group having 1–6 carbon atoms), $A_2^-$ indicates a monovalent anion, c denotes an integer of 4–7, and d is an integer of 0–7;

(B1) An acid-cleavable group-containing resin which is insoluble or scarcely soluble in alkali, but becomes soluble in alkali when the acid-cleavable group is cleaved; and (B2) an alkali-soluble resin and an alkali solubility control agent.

The above object can also be achieved in the present invention by a negative-tone radiation sensitive resin composition comprising:

(A) a photoacid generator which is shown by the above formulas (1-1) or (1-2);

(C) an alkali-soluble resin;

(D) a compound capable of cross-linkable the alkali-soluble resin in the presence of an acid.

Other and further objects, features and advantages of the present invention will appear more fully from the following description.

DETAIL DESCRIPTION OF THE INVENTION AND PREFERRED EMBODIMENTS

The present invention will now be described in detail.

Photoacid generator

The photoacid generator (hereinafter referred to as photoacid generator (A)) used in the positive tone or negative radiation sensitive resin composition of the present invention is a compound represented by the above formulas (1-1) or (1-2).

This compound chemically change on being irradiated.

In formulas (1-1) and (1-2), as examples of the alkyl group having 1-4 carbon atoms represented by $R^1$, $R^2$, $R^5$, or $R^6$, methyl group, ethyl group, n-propyl group, i-propyl group, n-butyl group, i-butyl group, sec-butyl group, and t-butyl group can be given.

As examples of —$OR^4$ representing $R^3$ or $R^7$ representing —$OR^8$, alkoxyl groups such as methoxy group, ethoxy group, n-propoxy group, i-propoxy group, n-butoxy group, i-butoxy group, sec-butoxy group, and t-butoxy group; alkoxyalkoxyl groups such as methoxymethoxy group, ethoxymethoxy group, n-propoxymethoxy group, i-propoxymethoxy group, 1-methoxyethoxy group, 1-ethoxyethoxy group, 1-n-propoxyethoxy group, 1-i-propoxyethoxy group, 2-methoxyethoxy group, 2-ethoxyethoxy group, 2-n-propoxyethoxy group, 2-i-propoxyethoxy group, 1-methoxypropoxy group, 2-methoxypropoxy group, 3-methoxypropoxy group, 1-ethoxypropoxy group, 2-ethoxypropoxy group, and 3-ethoxypropoxy group; alkoxy carbonyloxy groups such as methoxycarbonyloxy group, ethoxycarbonyloxy group, n-propoxycarbonyloxy group, i-propoxycarbonyloxy group, n-butoxycarbonyloxy group, i-butoxycarbonyloxy group, sec-butoxycarbonyloxy group, and t-butoxycarbonyloxy group; cyclic acetal group such as 2-tetrahydrofuranyloxy group and 2-tetrahydropyranyloxy group; (substituted) benzyloxy groups such as benzyloxy group, o-methylbenzyloxy group, m-methylbenzyloxy group, p-methylbenzyloxy group, p-t-butylbenzyloxy group, and p-methoxybenzyloxy group; and alkoxy carbonylmethyl groups such as methoxycarbonylmethyl group, ethoxycarbonylmethyl group, n-propoxycarbonylmethyl group, i-propoxycarbonylmethyl group, n-butoxycarbonylmethyl group, i-butoxycarbonylmethyl group, sec-butoxycarbonylmethyl group, and t-butoxycarbonylmethyl group.

As examples of the monovalent anion represented by $A_1^-$ or $A_2^-$, inaddition to sulfonic acid anions originating from sulfonic acid such as trifluoromethanesulfonic acid, nonafluorobutanesulfonic acid, dodecylbenzenesulfonic acid, toluenesulfonic acid, naphthalenesulfonic acid, pyrenesulfonicacid, andcamphorsulfonicacid, $BF_4^-$, $F_6P^-$, $F_6As^-$, $F_6Sb^-$, and $ClO_4^-$ are given.

Such an acid generator (A) can be synthesized via reaction intermediates shown in the following formula according to the reactions shown by the following reaction formula.

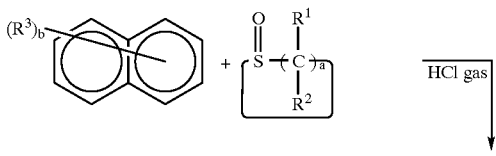

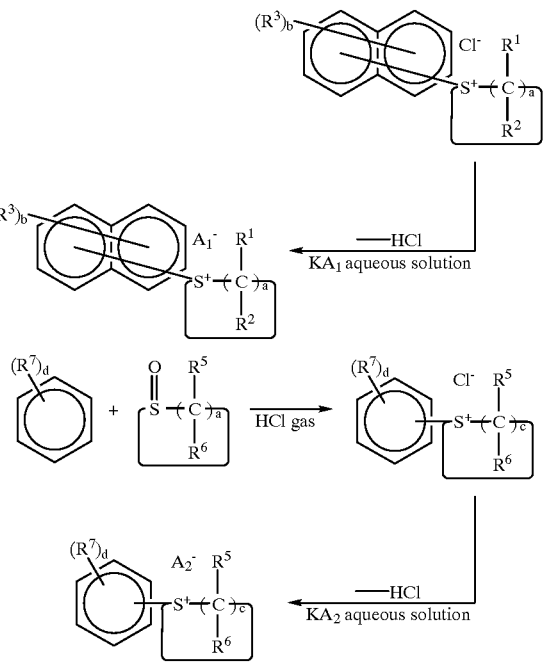

The following compounds are given as specific examples of acid generator (A): salts of 4-substituted 1-naphthyl-tetrahydrothiophenium such as 4-hydroxy-1-naphthyltetrahydrothiophenium trifluoromethanesulfonate, 4-methoxy-1-naphthyltetrahydrothiophenium trifluoromethanesulfonate, 4-ethoxy-1-naphthyltetrahydrothiophenium trifluoromethane-sulfonate, 4-n-butoxy-1-naphthyltetrahydrothiophenium trifluoromethanesulfonate, 4-t-butoxy-1-naphthyltetrahydrothiophenium trifluoromethanesulfonate, 4-n-propoxy-1-naphthyltetrahydrothiophenium trifluoromethanesulfonate, 4-methoxymethoxy-1-naphthyltetrahydrothiophenium trifluoromethanesulfonate, 4-ethoxymethoxy-1-naphthyltetrahydrothiophenium trifluoromethanesulfonate, 4-(1-methoxyethoxy)-1-naphthyltetrahydrothiophenium trifluoromethanesulfonate, 4-(2-methoxyethoxy)-1-naphthyltetrahydrothiophenium trifluoromethanesulfonate, 4-methoxycarbonyloxy-1-naphthyltetrahydrothiophenium trifluoromethanesulfonate, 4-ethoxycarbonyloxy-1-naphthyltetrahydrothiophenium trifluoromethanesulfonate, 4-n-propoxycarbonyloxy-1-naphthyltetrahydrothipheniu trifluoromethanesulfonate, 4-i-propoxycarbonyloxy-1-naphthyltetrahydrothiophenium trifluoromethanesulfonate, 4-n-butoxycarbonyloxy-1-naphthyltetrahydrothiophenium trifluoromethanesulfonate, 4-t-butoxycarbonyloxy-1-naphthyltetrahydrothiophenium trifluoromethane sulfonate, 4-(2-tetrahydrofuranyloxy)-1-naphthyltetrahydrothiophenium trifluoromethanesulfonate, 4-(2-tetrahydropyranyloxy)-1-naphthyltetrahydrothiophenium trifluoromethanesulfonate, 4-benzyloxy-1-naphthyltetra-hydrothiophenium trifluoromethanesulfonate, 4-hydroxy-1-naphthyltetrahydrothiophenium n-nonafluorobutanesulfonate, 4-methoxy-1-naphthyltetrahydrothiophenium n-nonafluorobutanesulfonate, 4-n-butoxy-1-naphthyltetrahydrothiophenium n-nonafluorobutanesulfonate, 4-t-butoxy-1-naphthyltetrahydrothiophenium n-nonafluorobutanesulfonate, 4-hydroxy-1- naphthyltetrahydrothiophenium camphorsulfonate, 4-methoxy-1-naphthyltetrahydrothiophenium camphorsulfonate, 4-n-butoxy-1-naphthyltetrahydrothiophenium camphorsulfonate, 4-t-butoxy-1-naphthyltetrahydrothiophenium camphorsulfonate, 4-hydroxy-1-naphthyltetrahydrothiophenium hexafluoroantimonate, and 4-hydroxy-1-naphthyltetrahydrothiophenium p-toluenesulfonate; salt of 5-substituted 1-naphthyltetrahydrothiophenium, such as 5-hydroxy-1-naphthyltetrahydrothiophenium trifluoromethanesulfonate, 5-methoxy-1-naphthyltetra-hydrothiophenium trifluoromethanesulfonate, 5-ethoxy-1-naphthyltetrahydrothiophenium trifluoromethanesulfonate, 5-n-propoxy-1-naphthyltetrahydrothiophenium trifluoromethanesulfonate, 5-methoxymethoxy-1-naphthyltetrahydrothiophenium trifluoromethanesulfonate, 5-ethoxymethoxy-1-naphthyltetrahydrothiophenium trifluoromethanesulfonate, 5-(1-methoxyethoxy)-1-naphthyltetrahydrothiophenium trifluoromethanesulfonate, 5-(2-methoxyethoxy)-—naphthyl tetrahydrothiophenium trifluoromethanesulfonate, 5-methoxycarbonyloxy-1-naphthyltetrahydrothiophenium trifluoromethanesulfonate, 5-ethoxycarbonyloxy-1-naphthyltetrahydrothiophenium trifluoromethanesulfonate, 5-n-propoxycarbonyloxy-1-naphthyltetrahydrothiophenium trifluoromethanesulfonate, 5-i-propoxycarbonyloxy-1-naphthyltetrahydrothiophenium trifluoromethanesulfonate, 5-n-butoxycarbonyloxy-1-naphthyltetrahydrothiophenium trifluoromethanesulfonate, 5-t-butoxycarbonyloxy-1-naphthyl tetrahydrothiophenium trifluoromethanesulfonate, 5-(2-tetrahydrofuranyloxy)-1-naphthyltetrahydrothiophenium trifluoromethanesulfonate, 5-(2-tetrahydropyranyloxy)-1-naphthyltetrahydrothiophenium trifluoromethanesulfonate, 5-benzyloxy-1-naphthyltetrahydrothiophenium trifluoromethanesulfonate, 5-hydroxy-1-naphthyltetrahydrothiophenium hexafluoroantimonate, and 5-hydroxy-1-naphthyltetrahydrothiophenium p-toluenesulfonate; salts of 6-substituted 1-naphthyltetrahydrothiophenium, such as 6-hydroxy-d-naphthyltetrahydrothiophenium trifluoromethanesulfonate, 6-methoxy-1-naphthyltetrahydrothiophenium trifluoromethanesulfonate, 6-ethoxy-1-naphthyltetrahydrothiophenium trifluoromethanesulfonate, 6-n-propoxy-1-naphthyltetrahydrothiophenium trifluoromethanesulfonate, 6-methoxymethoxy-1-naphthyltetrahydrothiophenium trifluoromethanesulfonate, 6-ethoxymethoxy-1-naphthyltetrahydrothiophenium trifluoromethanesulfonate, 6-(1-methoxyethoxy)-1-naphthyltetrahydrothiophenium trifluoromethanesulfonate, 6-(2-methoxyethoxy)-1-naphthyltetrahydrothiophenium trifluoromethanesulfonate, 6-methoxycarbonyloxy-1-naphthyltetrahydrothiophenium trifluoromethanesulfonate, 6-ethoxycarbonyloxy-1-naphthyltetrahydrothiophenium trifluoromethanesulfonate, 6-n-propoxycarbonyloxy-1-naphthyltetrahydrothiophenium trifluoromethanesulfonate, 6-i-propoxycarbonyloxy-1-naphthyltetrahydrothiophenium trifluoromethanesulfonate, 6-n-butoxycarbonyloxy-1-naphthyltetrahydrothiophenium trifluoromethanesulfonate, 6-t-butoxy carbonyloxy-1-naphthyltetrahydrothiophenium trifluoromethanesulfonate, 6-(2-tetrahydrofuranyloxy)-1-naphthyltetrahydrothiophenium trifluoromethanesulfonate, 6-(2-tetrahydropyranyloxy)-1-naphthyltetrahydrothiophenium trifluoromethanesulfonate, 6-benzyloxy-1-naphthyltetrahydrothiophenium trifluoromethanesulfonate, 6-hydroxy-1-naphthyltetrahydrothiophenium hexafluoroantimonate, and 6-hydroxy-1-naphthyltetrahydrothiophenium p-toluenesulfonate; salts 7-substituted 1-naphthyltetrahydrothiophenium, such as 7-hydroxy-1-naphthyltetrahydrothiophenium trifluoromethanesulfonate, 7-methoxy-1-naphthyltetrahydrothiophenium trifluoromethanesulfonate, 7-ethoxy-1-naphthyltetrahydrothiophenium trifluoromethanesulfonate, 7-n-propoxy-1-naphthyltetrahydrothiophenium trifluoromethanesulfonate, 7-methoxymethoxy-1-naphthyltetrahydrothiophenium trifluoromethanesulfonate, 7-ethoxymethoxy-1-naphthyltetrahydrothiophenium trifluoromethanesulfonate, 7-(2-methoxyethoxy)-1-naphthyltetrahydrothiophenium trifluoromethanesulfonate, 7-(2-methoxyethoxy)-1-naphthyltetrahydrothiophenium trifluoromethanesulfonate, 7-methoxycarbonyloxy-1-naphthyltetrahydrothiophenium trifluoromethanesulfonate, 7-ethoxycarbonyloxy-1-naphthyltetrahydrothiophenium trifluoromethanesulfonate, 7-n-propoxycarbonyloxy-1-naphthyltetrahydrothiophenium trifluoromethanesulfonate, 7-i-propoxycarbonyloxy-1-naphthyltetrahydrothiophenium trifluoromethanesulfonate, 7-n-butoxycarbonyloxy-1-naphthyl tetrahydrothiophenium trifluoromethanesulfonate, 7-t-butoxy carbonyloxy-1-naphthyltetrahydrothiophenium trifluoromethanesulfonate, 7-(2-tetrahydrofuranyloxy)-1-naphthyl tetrahydrothiophenium trifluoromethanesulfonate, 7-(2-tetrahydropyranyloxy)-1-naphthyltetrahydrothiophenium trifluoromethanesulfonate, 7-benzyloxy-1-naphthyltetrahydrothiophenium trifluoromethanesulfonate, 7-hydroxy-1-naphthyltetrahydrothiophenium hexafluoroantimonate, and 7-hydroxy-1-naphthyltetrahydrothiophenium p-toluenesulfonate; salts of 4-substituted 1-phenyltetrahydrothiophenium, such as 4-hydroxy-1-phenyltetrahydrothiophenium trifluoromethanesulfonate, 4-methoxy-1-phenyltetrahydrothiophenium trifluoromethanesulfonate, 4-ethoxy-1-phenyltetrahydrothiophenium trifluoromethanesulfonate, 4-n-propoxy-1-phenyltetrahydrothiophenium trifluoromethanesulfonate, 4-methoxymethoxy-1-phenyltetrahydrothiophenium trifluoromethanesulfonate, 4-ethoxymethoxy-1-phenyltetrahydrothiophenium trifluoromethanesulfonate, 4-(1-methoxyethoxy)-1-phenyltetrahydrothiophenium trifluoromethanesulfonate, 4-(2-methoxyethoxy)-1-phenyltetrahydrothiophenium trifluoromethanesulfonate, 4-methoxycarbonyloxy-1-phenyltetrahydrothiophenium trifluoromethanesulfonate, 4-ethoxycarbonyloxy-1-phenyltetrahydrothiophenium trifluoromethanesulfonate, 4-n-propoxycarbonyloxy-1-phenyltetrahydrothiophenium trifluoromethanesulfonate, 4-i-propoxycarbonyloxy-1-phenyl-tetrahydrothiophenium trifluoromethanesulfonate, 4-n-butoxycarbonyloxy-1-phenyltetrahydrothiophenium trifluoromethanesulfonate, 4-t-butoxycarbonyloxy-1-phenyl-tetrahydrothiophenium trifluoromethanesulfonate, 4-(2-tetrahydrofuranyloxy)-1-phenyltetrahydrothiophenium trifluoromethanesulfonate, 4-(2-tetrahydropyranyloxy)-1-phenyltetrahydrothiophenium trifluoromethanesulfonate, 4-benzyloxy-1-phenyltetrahydrothiophenium trifluoromethanesulfonate, 4-hydroxy-1-phenyltetrahydrothiophenium hexafluoroantimonate, and 4-hydroxy-1-phenyltetrahydrothiophenium p-toluenesulfonate; salts of 3-substituted 1-phenyltetrahydrothiophenium, such as 3-hydroxy-1-phenyltetrahydrothiophenium trifluoromethanesulfonate, 3-methoxy-1-phenyltetrahydrothiophenium trifluoromethanesulfonate, 3-ethoxy-1-phenyl tetrahydro thiophenium trifluoromethane sulfonate, 3-n-propoxy-1- phenyl tetrahydro thiophenium trifluoromethane sulfonate, 3-methoxymethoxy-1-phenyltetrahydrothiophenium trifluoromethanesulfonate, 3-ethoxymethoxy-1-phenyltetrahydrothiophenium trifluoromethanesulfonate, 3-(1-methoxyethoxy)-1-phenyltetrahydrothiophenium trifluoromethanesulfonate, 3-(2-methoxyethoxy)-1-phenyltetrahydrothiophenium trifluoromethanesulfonate, 3-methoxycarbonyloxy-1-phenyltetrahydrothiophenium trifluoromethanesulfonate, 3-ethoxycarbonyloxy-1-phenyltetrahydrothiophenium trifluoromethanesulfonate, 3-n-propoxycarbonyloxy-1-phenyltetrahydrothiophenium trifluoromethanesulfonate, 3-i-propoxycarbonyloxy-1-phenyltetrahydrothiophenium trifluoromethanesulfonate, 3-n-butoxycarbonyloxy-1-phenyltetrahydrothiophenium trifluoromethanesulfonate, 3-t-butoxy carbonyloxy-1-phenyltetrahydrothiophenium trifluoromethanesulfonate, 3-(2-tetrahydrofuranyloxy)-1-phenyltetrahydrothiophenium trifluoromethanesulfonate, 3-(2-tetrahydropyranyloxy)-1-phenyltetrahydrothiophenium trifluoromethanesulfonate, 3-benzyloxy-1-phenyltetrahydrothiophenium trifluoromethanesulfonate, 3-hydroxy-1-phenyl tetrahydrothiophenium hexafluoroantimonate, and 3-hydroxy-1-phenyltetrahydrothiophenium p-toluenesulfonate.

Of these acid generators (A), particularly preferred are are 4-hydroxy-1-naphthyltetrahydrothiophenium trifluoromethanesulfonate, 4-methoxy-1-naphthyltetrahydrothiophenium trifluoromethanesulfonate, 4-n-butoxy-1-naphthyltetrahydrothiophenium trifluoromethanesulfonate, 4-t-butoxy-1-naphthyltetrahydrothiophenium trifluoromethanesulfonate, 4-hydroxy-1-naphthyltetrahydrothiophenium n-nonafluorobutanesulfonate, 4-methoxy-1-naphthyltetrahydrothiophenium n-nonafluorobutanesulfonate, 4-n-butoxy-1-naphthyltetrahydrothiophenium n-nonafluorobutanesulfonate, and 4-t-butoxy-1-naphthyltetrahydrothiophenium n-nonafluorobutanesulfonate.

These compounds may be used either individually or in combinations of two or more as the acid generator (A) in the positive-tone or negative-tone radiation sensitive resin composition of the present invention.

Acid generators other than the acid generators (A) may be added to the positive tone or negative tone radiation sensitive resin composition of the present invention inasmuch as the intended effects are not adversely affected.

Such other acid generators include, for example, ① onium salts, ② halogen-containing compounds, ③ diazoketone compounds, ④ sulfone compounds, and ⑤ sulfonic acid compounds.

The following compounds can be given as examples of such acid generators.

① Onium salt

As onium salts, iodonium salts, sulfonium salts, phosphonium salts, diazonium salts, and pyridinium salts can be given.

Specific examples of desirable onium salts include diphenyliodonium trifluoromethanesulfonate, diphenyliodonium pyrenesulfonate, diphenyliodonium dodecylbenzenesulfonate, bis(4-t-butylphenyl)iodonium trifluoromethanesulfonate, bis(4-t-butylphenyl)iodonium dodecylbenzenesulfonate, bis(4-t-butylphenyl)iodonium naphthalenesulfonate, bis (4-t-butylphenyl)iodonium hexafluoroantimonate, triphenylsulfonium trifluoromethanesulfonate, triphenylsulfonium hexafluoroantimonate, triphenylsulfonium naphthalenesulfonate, (hydroxyphenyl) benzenemethylsulfonium toluen esulfonate, 1-(naphthylacetomethyl)thiolanium trifluoromethanesulfonate, cyclohexylmethyl(2-oxocyclohexyl)sulfonium trifluoromethanesulfonate, dicyclohexyl(2-oxocyclohexyl)sulfonium trifluoromethanesulfonate, dimethyl(2-oxocyclohexyl)sulfonium trifluoromethanesulfonate, 1-naphthyldimethylsulfonium trifluoromethanesulfonate, 1-naphthyldiethylsulfonium trifluoromethanesulfonate, 1-naphthyldi-n-propylsulfonium trifluoromethanesulfonate, 1-naphthyldi-i-propylsulfonium trifluoromethanesulfonate, 4-cyano-1-naphthyldimethylsulfonium trifluoromethanesulfonate, 4-nitro-1-naphthyldimethylsulfonium trifluoromethanesulfonate, 4-methyl-1-naphthyldimethylsulfonium trifluoromethanesulfonate, 4-cyano-i-naphthyldiethylsulfonium trifluoromethanesulfonate, 4-nitro-1-naphthyldiethylsulfonium trifluoromethanesulfonate, 4-methyl-1-naphthyldiethylsulfonium trifluoromethanesulfonate, 4-hydroxy-1-naphthyldimethylsulfonium trifluoromethanesulfonate, 5-hydroxy-1-naphthyldimethylsulfonium trifluoromethanesulfonate, 6-hydroxy-1-naphthyldimethylsulfonium trifluoromethanesulfonate, and 7-hydroxy-1-naphthyldimethylsulfonium trifluoromethanesulfonate.

② Halogen-containing compounds

As halogen-containing compound, for example, haloalkyl group-containing hydrocarbon compounds, and haloalkyl group-containing heterocyclic compounds can be given.

Given as specific examples of desirable halogen-containing compounds are 1,1-bis(4-chlorophenyl)-2,2,2-trichloroethane, phenyl-bis(trichoromethyl)-s-triazine, methoxyphenyl- bis(tri chloromethyl)-s-triazine, and naphthyl-bis(trichloromethyl)-s-triazine.

③ Diazoketone compounds

As diazoketone compounds, for example, 1,3-diketo-2-diazo compound, diazobenzoquinone compound, and diazonaphthoquinone compound can be given.

Specific examples of desirable diazoketones include 1,2-naphthoquinone diazido-4-sulfonyl chloride, 1,2-naphthoquinone diazido-4-sulfonate of 2,3,4,4'-tetrahydroxybenzophenone, and 1,2-naphthoquinone diazido-4-sulfonate of 1,1,1-tris (4-hydroxyphenyl)ethane.

④ Sulfone compounds

Sulfone compounds include β-ketosulfone, β-sulfonylsulfone, and the like.

As specific examples of desirable sulfone compounds, 4-trisphenacylsulfone, mesitylphenacylsulfone, and bis (phenylsulfonyl)methane can be given.

⑤ Sulfonic acid compounds

Alkyl sulfonates, alkyl sulfonic acid imides, haloalkyl sulfonates, arylsulfonates, imidesulfonates, and the like can be given as examples of sulfonic acid compounds.

Specific examples of desirable sulfonic acid compounds -include benzointosylate, tristrifluoromethane sulfonate of pyrogallol, nitrobenzyl-9,10-diethoxyanthracene-2-sulfonate, trifluoromethane sulfonyl bicyclo[2.2.1]hepto-5-ene-2,3-dicarboxyimide, n-hydroxysuccinimide trifluoromethanesulfonate, and 1,8-naphthalenedicarboxyimide trifluoromethanesulfonate.

Of these acid generators other than acid generators (A) (hereinafter called "the other acid generators"), particularly preferred are diphenyliodonium trifluoromethanesulfonate, bis(4-t-butylphenyl)iodonium trifluoromethanesulfonate, triphenylsulfonium trifluoromethanesulfonate, cyclohexylmethyl(2-oxocyclohexyl)sulfonium trifluoromethanesulfonate, dicyclohexyl(2-oxocyclohexyl) sulfonium trifluoromethanesulfonate, dimethyl(2-oxocyclohexyl)sulfonium trifluoromethanesulfonate, trifluoromethanesulfonylbicyclo[2.2.1]hepto-5-ene-2,3-dicarboxyimide, n-hydroxysuccinimide trifluoromethanesulfonate, 1,8-naphthalenedicarboxyimide trifluoromethanesulfonate, and 4-hydroxy-1-naphthyldimethylsulfonium trifluoromethanesulfonate.

These other acid generators may be used either individually or in combinations of two or more. The amount of the other acid generators used in the positive tone or negative tone radiation sensitive resin composition of the present invention is usually less than 20 parts by weight, preferably 10 parts by weight, and more preferably 8 parts by weight, for 100 parts by weight of the acid generator (A). If the amount of the other acid generators exceeds 20 parts by weights, transmissivity of radiation is small so that no sufficient amount of radiation reaches the lower part of a resist film when the composition is used as a resist. In the case of a positive tone resist, the resulting resist pattern tends to be tapered. In the case of a positive tone resist, the resist pattern tends to have an inverse triangular shape.

Acid-cleavable group-containing resin

The acid-cleavable group-containing resin used as the component (B1) in the positivie tone radiation sensitive resin composition of the present invention is a resin insoluble or scarcely soluble in alkali, but becomes soluble in alkali when the acid-cleavable group is cleaved. The following resin (I) and resin (II) can be given as examples of the acid-cleavable group containing resin.

The resin (I) has a structure wherein hydrogen atoms in acidic functional groups, such as phenolic hydroxyl group, naphtholic hydroxyl group, carboxyl group, or the like, in an alkali-soluble resin are replaced by at least one acid-cleavable group. The resin (I) is alkali insoluble or scarcely soluble in alkali by itself.

The resin (II) is an acid-cleavable group-containing resin having an alicyclic structure in the main chain. The resin (II) is also alkali insoluble or scarcely soluble in alkali by itself.

The term "insoluble or scarcely soluble in alkali" is defined as the characteristics of a resin (an acid cleavable group-containing resin), in which at least 50% (in thickness) of the coating prepared from the resin remains undissolved when developed under the same alkaline developing conditions as the conditions under which resist patterns are formed on a resist coating made from a radiation sensitive resin composition containing the acid cleavable group-containing resin.

The resin (I) and resin (II) will now be described in detail.

Given as examples of the acid-cleavable group in the resin (I) (hereinafter called "acid-cleavable group (i)") are substituted methyl group, 1-substituted ethyl group, 1-branched alkyl group, silyl group, germyl group, alkoxycarbonyl group, acyl group, and cyclic acid-cleavable group.

Examples of the above substituted methyl group included methoxymethyl group, methylthiomethyl group, ethoxymethyl group, ethylthiomethyl group, methoxyethoxymethyl group, benzyloxymethyl group, benzylthiomethyl group, phenacyl group, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group, methoxycarbonyl-methyl group, ethoxycarbonylmethyl group, n-propoxycarbonyl-methyl group, iso-propoxycarbonylmethyl group, n-butoxy-carbonylmethyl group, and t-butoxycarbonylmethyl group.

Included in examples of the above-mentioned 1-substituted ethyl group are 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonyl group, 1-n-propoxycarbonylethyl group, 1-iso-propoxycarbonylethyl group, 1-n-butoxycarbonylethyl group, and 1-t-butoxycarbonylethyl group.

Examples of the 1-branched alkyl group are isopropyl group, sec-butyl group, t-butyl group, 1,1-dimethylpropyl group, 1-methylbutyl group, and 1,1-dimethylbutyl group Examples of the above silyl group include trimethylsilyl group, ethyldimethylsilyl group, methyldiethylsilyl group, triethylsilyl group, isopropyldimethylsilyl group, methyldi-isopropylsilyl group, tri-isopropylsilyl group, t-butyldimethylsilyl group, methyl-di-t-butylsilyl group, tri-t-butylsilyl group, phenyldimethylsilyl group, methyldiphenylsilyl group, and triphenylsilyl group.

Examples of the above germyl group include trimethylgermyl group, ethyldimethylgermyl group, methyldiethylgermyl group, triethylgermyl group, isopropyldimethylgermyl group, methyldiisopropylgermyl group, triisopropylgermyl group, t-butyldimethylgermyl group, methyldi-t-butylgermyl group, tri-t-butylgermyl group, phenyldimethylgermyl group, methyldiphenylgermyl group, and triphenylgermyl group.

Methoxycarbonyl group, ethoxycarbonyl group, isopropoxycarbonyl group, and t-butoxycarbonyl group are given as examples of the above alkoxycarbonyl group.

Given as examples of the foregoing acyl group are acetyl group, propionyl group, butyryl group, heptanoyl group, hexanoyl group, valeryl group, pivaloyl group, iso-valeryl group, lauryloyl group, myristoyl group, palmitoyl group, stearoyl group, oxalyl group, malonyl group, scucinyl group, glutary group, adipoyl group, piperoyl group, suberoyl group, azelaoyl group, sebacoyl group, acryloyl group, propioyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, and mesyl group.

Further, given as examples of the foregoing cyclic acid-cleavable group are groups having an alicyclic structure, such as cyclopropyl group, cyclopentyl group, cyclohexyl group, cyclohexenyl group, and 4-methoxycyclohexyl group. Tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, and 3-tetrahydrothiophene-1-dioxide group can also be given.

Of these acid-cleavable groups (i), particularly preferred are t-butyl group, t-butoxycarbonyl group, 1-methoxyethyl group, 1-ethoxyethyl group, 1-n-butoxyethyl group, tetrahydropyranyl group, methyltetrahydropyranyl group, tetrahydrofuranyl group, and methyltetrahydrofuranyl group.

The content of the acid-cleavable groups (i) in the resin (i) (i.e. the proportion of the number of acid-cleavable groups for the total number of the acidic functional groups and the acid-cleavable groups (i) in the acid-cleavable group containing resin) is preferably 5–100%, and more preferably 20–100% in addition. If the content of the acid-cleavable groups (i) is less than 5%, resolution of the resist tends to decrease.

The resin (I) can be manufactured by following methods.

(a) A method of introducing one or more acid-cleavable groups (i) into an alkali-soluble resin which has been manufactured in advance.

(b) A method of of subjecting one or more polymerizable unsaturated compound having one or more acid-cleavable groups (i) to (co)polymerization.

(c) A method of subjecting polycondensation components having one or more acid-cleavable groups (i) to (co)polycondensation.

As the alkali-soluble resin used in the above method (a), addition polymerization resins or polycondensation resins having one or more recurring unit which contains an acidic functional group can be given as an example.

Here, given as examples of the recurring units containing an acidic functional group in the addition polymerization type alkali-soluble resin are the units which can be produced by cleavage of a polymerizable unsaturated bond in a polymerizable unsaturated compound having an acidic functional group. Specific examples of such recurring units include: ($\alpha$-methyl)styrene derivatives, such as o-hydroxystyrene, m-hydroxystyrene, p-hydroxystyrene, o-hydroxy-$\alpha$-methylstyrene, m-hydroxy-$\alpha$-methylstyrene, p-hydroxy-$\alpha$-methylstyrene, p-carboxystyrene, p-carboxymethylstyrene, p-(2-carboxyethyl)styrene, p-carboxymethoxystyrene, p-(2-carboxyethoxy)styrene, and p-carboxymethylcarbonyloxystyrene, p-(2-carboxyethyl)carbonyloxystyrene; vinylnaphthalene derivatives or iso-propenylnaphthalene derivatives, such as 2-hydroxy-1-vinyl naphthalene, 3-hydroxy-1-vinyl naphthalene, 4-hydroxy-1-vinylnaphthalene, 5-hydroxy-1-vinylnaphthalene, 6-hydroxy-1-vinylnaphthalene, 7-hydroxy-1-vinylnaphthalene, 8-hydroxy-1-vinylnaphthalene, 2-hydroxy-1-iso-propenylnaphthalene, 3-hydroxy-1-iso-propenylnaphthalene, 4-hydroxy-1-iso-propenylnaphthalene, 5-hydroxy-1-iso-propenylnaphthalene, 6-hydroxy-1-iso-propenylnaphthalene, 7-hydroxy-1-iso-propenylnaphthalene, 8-hydroxy-1-iso-propenylnaphthalene, 2-carboxy-1-vinylnaphthalene, 3-carboxy-1-vinylnaphthalene, 4-carboxy-1-vinylnaphthalene, 5-carboxy-1-vinylnaphthalene, 6-carboxy-1-vinylnaphthalene, 7-carboxy-1-vinylnaphthalene, and 8-carboxy-1-vinylnaphthalene; unsaturated carboxylic acids, such as (meth) acrylic acid, crotonic acid, maleic acid, fumaric acid, itaconic acid, citraconic acid, mesaconic acid, and cinnamic acid; carboxyl group-containing unsaturated carboxylic acid esters, such as 2-carboxyethyl(meth)acrylate, 2-carboxypropyl(meth)acrylate, 3-carboxypropyl (meth)acrylate, and 4-carboxybutyl(meth)acrylate.

Of these recurring units, the units produced by the cleavage of polymerizable unsaturated bonds, such as p-hydroxystyrene, p-hydroxy-$\alpha$-methylstyrene, p-carboxystyrene, and (meth)acrylic acid are preferred.

The addition polymerization type alkali-soluble resin may be formed only of the recurring units having an acidic functional group, or may further comprise one or more other unit with a structure wherein a polymerizable unsaturated bond of other polymerizable unsaturated compound is cleaved, inasmuch as the resulting resin is alkali-soluble.

The following compounds can be given as examples of such other polymerizable unsaturated compounds: vinyl aromatic compounds, such as styrene, $\alpha$-methylstyrene, 4-t-butylstyrene, 4-t-butyl-$\alpha$-methylstyrene, 1-vinylnaphthalene, 4-methyl-1-vinylnaphthalene, 5-methyl-1-vinylnaphthalene, 1-iso-propenylnaphthalene, 4-chloro-1-vinylnaphthalene, 5-chloro-1-vinylnaphthalene, 4-methoxy-1-vinylnaphthalene, and 5-methoxy-1-vinylnaphthalene; (meth)acrylates, such as methyl (meth)acrylate, ethyl (meth) acrylate, n-propyl(meth)acrylate, n-butyl(meth)acrylate, 2-hydroxyethyl (meth) acrylate, 2-hydroxypropyl (meth) acrylate, and 3-hydroxypropyl (meth)acrylate; (meth)acrylates having an alicyclic structure in the ester group, such as norbornyl(meth)acrylate, isobornyl(meth)acrylate, tricyclodecanyl(meth)acrylate, dicyclopentenyl(meth)acrylate, and adamantyl(meth)acrylate; vinyl esters, such as vinyl acetate, vinyl propionate, and vinyl butyrate; and unsaturated nitrile compounds, such as (meth)acrylonitrile, a-chloroacrylonitrile, crotonitrile, maleinitril, fumaronitril, mesaconitrile, citraconitrile, and itaconitrile; unsaturated amide compounds, such as (meth) acrylamide, N,N-dimethyl(meth)acrylamide, crotonamide, maleinamide, fumaramide, mesaconamide, citraconamide, and itaconamide; nitrogen-containing vinyl compounds, such as N-vinyl-c-caprolactam, N-vinylpyrrolidone, vinylpyridine, and vinylimidazole.

Of these other polymerizable unsaturated compounds, particularly preferred are styrene, a-methylstyrene, methyl (meth)acrylate, 2-hydroxyethyl(meth)acrylate, 2-hydroxypropyl(meth)acrylate, and (meth)acrylates having an alicyclic structure in the ester group, such as isobornyl (meth)acrylate, tricyclodecanyl(meth)acrylate, dicyclopentenyl(meth)acrylate, and adamantyl(meth)acrylate.

The above-described polycondensation type alkali-soluble resins can be prepared by the polycondensation of one or more phenol compound, one or more aldehyde compound, and, optionally, other polycondensation components which can form other recurring unit, in an aqueous medium or in a mixture of water and a hydrophilic solvent in the presence of an acidic catalyst.

As examples of the phenol compounds used in the polycondensation, o-cresol, m-cresol, p-cresol, 2,3-xylenol, 2,4-xylenol, 2,5-xylenol, 3,4-xylenol, 3,5-xylenol, 2,3,5-trimethylphenol, 3,4, 5-trimethylphenol, resorcinol, catechol, pyrogallol, 1-naphthol, and 2-naphthol can be given. As examples of the aldehyde compounds, formaldehyde, trioxane, paraformaldehyde, benzaldehyde, acetaldehyde, propylaldehyde, and phenylacetaldehyde can be given.

Because the content of the recurring units having an acidic functional group in the addition polymerization alkali-soluble resin or the polycondensation type alkali-soluble resin is varied according to the type of the recurring unit and other recurring units used, such a content cannot be generically specified. Usually, a content of 10–100 mol % is preferable, with more preferable content being 15–100 mol %.

As examples of the polymerizable unsaturated compound having the acid-cleavable group (i) which is used in the method (b), the compounds with the hydrogen atoms in acidic functional groups in the polymerizable unsaturated compounds illustrated in the above method (a) substituted by the acid-cleavable group (i) can be given. As examples of the polycondensation component having an acid-cleavable group (i) used in the above method (c), in addition to aldehyde compounds, the compounds with the hydrogen atoms in phenollic hydroxyl in the phenol compounds illustrated in connection with the method (a) substituted by an acid-cleavable group (i) can be given.

In the method (b) or method (c) also it is possible to use other polymerizable unsaturated compounds or other polycondensation components than the polymerizable unsaturated compound having an acid-cleavable group (i) or the polycondensation component having an acid-cleavable group (i) in an amount not exceeding 60 wt %, preferably in an amount of 50 wt % or less.

The polymerization for producing the addition polymerization type alkali-soluble resin according to the method (a) or the polymerization according to the method (b) can be carried out by means of bulk polymerization, solution polymerization, precipitation polymerization, emulsion polymerization, suspension polymerization, bulk-suspension polymerization in the presence of a suitably selected catalyst such as a radical polymerization initiator, anionic polymerization catalyst, conjugated anionic polymerization catalyst, and cationic polymerization catalyst.

The following resins can be given as desirable resin (I) used in the positive tone radiation curable resin composition of the present invention.

Styrene-containing resins, such as 4-t-butoxystyrene/4-hydroxystyrene copolymer, 4-t-butoxycarbonyloxystyrene/4-hydroxystyrene copolymer, 4-(1-ethoxyethoxy)styrene/4-hydroxystyrene copolymer, 4-(1-n-butoxyethoxy)styrene/4-hydroxystyrene copolymer, and 4-tetrahydropyranyloxystyrene/4-hydroxystyrene copolymer, 4-methyltetrahydropyranyloxystyrene/4-hydroxystyrene copolymer, 4-tetrahydrofuranyloxystyrene/4-hydroxystyrene copolymer, and 4-methyltetrahydrofuranyloxystyrene/4-hydroxystyrene copolymer; vinylnaphthalene type resins, such as 4-t-butoxy-1-vinylnaphthalene/4-hydroxy-1-vinylnaphthalene copolymer, 4-t-butoxycarbonyloxy-1-vinylnaphthalene/4-hydroxy-1-vinylnaphthalene copolymer, 4-(1-ethoxyethoxy)-1-vinylnaphthalene/4-hydroxy-1-vinylnaphthalene copolymer, 4-(1-n-butoxyethoxy)-1-vinylnaphthalene/4-hydroxy-1-vinylnaphthalene copolymer, 4-tetrahydropyranyloxy-1-vinylnaphthalene/4-hydroxy-1-vinylnaphthalene copolymer, 4-methyltetrahydropyranyloxy-1-vinylnaphthalene/4-hydroxy-1-vinylnaphthalene copolymer, 4-tetrahydrofuranyloxy-1-vinylnaphthalene/4-hydroxy-1-vinyl naphthalene copolymer, and 4-methyltetrahydrofuranyloxy-1-vinylnaphthalene/4-hydroxy-1-vinylnaphthalene copolymer; (meth)acrylate-type resins, such as t-butyl(meth)acrylate/tricyclodecanyl (meth)acrylate/(meth)acrylic acid copolymer, t-butoxycarbonyl(meth)acrylate/tricyclodecanyl (meth)acrylate/(meth)acrylic acid copolymer, 1-ethoxyethyl(meth)acrylate/tricyclodecanyl(meth)acrylate/(meth)acrylic acid copolymer, 1-butoxyethyl(meth)acrylate/ tricyclodecanyl (meth)acrylate/(meth)acrylic acid copolymer, tetrahydropyranyl(meth)acrylate/tricyclodecanyl (meth)acrylate/(meth)acrylic acid copolymer, methyltetrahydropyranyl(meth)acrylate/tricyclodecanyl (meth)acrylate/(meth)acrylic acid copolymer, tetrahydrofuranyl(meth)acrylate/tricyclodecanyl (meth)acrylate/(meth)acrylic acid copolymer, methyltetrahydrofuranyl(meth)acrylate/tricyclodecanyl (meth)acrylate/(meth)acrylic acid copolymer, t-butyl(meth)acrylate/tricyclodecanyl(meth)acrylate/2-hydroxypropyl (meth)acrylate copolymer, t-butoxycarbonyl(meth)acrylate/tricyclodecanyl(meth)acrylate/2-hydroxypropyl(meth) acrylate copolymer, 1-ethoxyethyl(meth)acrylate/tricyclodecanyl(meth)acrylate/2-hydroxypropyl(meth) acrylate copolymer, 1-butoxyethyl(meth)acrylate/tricyclodecanyl(meth)acrylate/2-hydroxypropyl(meth) acrylate copolymer, tetrahydropyranyl(meth)acrylate/tricyclodecanyl (meth)acrylate/ 2-hydroxypropyl(meth)acrylate copolymer, methyltetrahydropyranyl(meth)acrylate/tricyclodecanyl (meth)acrylate/2-hydroxypropyl (meth)acrylate copolymer, tetrahydrofuranyl(meth)acrylate/tricyclodecanyl (meth)acrylate/2-hydroxypropyl(meth) acrylate copolymer, and methyltetrahydrofuranyl(meth)acrylate/tricyclodecanyl (meth)acrylate/2-hydroxypropyl (meth)acrylate copolymer;

In the resin (II), the alicyclic structure may be either monocyclic structure originating from cycloalkanes or polycyclic structure originating from bicyclo [2.2.1] heptane, tetracyclo[$4.4.0.1^{2,5}.1^{7,10}$]dodecane, or the like.

Although the acid-cleavable groups in the resin (II) may be present at any optional position, it is desirable that these groups be on the alicyclic structure. This alicyclic structure may have one or more substituted groups other than the acid-cleavable groups, such as, for example, a halogen atom, hydrocarbon group having 1–10 carbon atoms, and halogenated hydrocarbon group having 1–10 carbon atoms.

The resins having at least one recurring unit of the following formulas (2) or (3) are desirable as the resin (II).

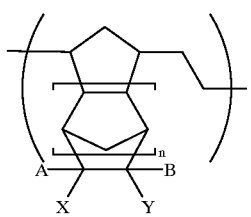

(2)

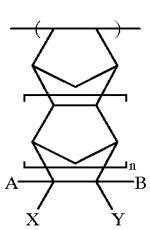

(3)

wherein n is 0 or 1; A and B individually represent a hydrogen atom, halogen atom, hydrocarbon group having 1–10 carbon atoms, or halogenated hydrocarbon groups having 1–10 carbon atoms; and X and Y individually represent a hydrogen atom, halogen atom, hydrocarbon group having 1–10 carbon atoms, halogenated hydrocarbon groups having 1–10 carbon atoms, or acid-cleavable group, provided that at least one of X and Y an acid-cleavable group.

Preferred groups for the acid-cleavable groups in the formulas (2) and (3) (hereinafter referred to as "acid-cleavable group (ii)") are the groups represented by —$R^9COOR^{10}$, —$R^9OCOR^{11}$, or —$R^9CN$, wherein $R^9$ indicates —$(CH_2)_i$—, i is an integer of 0–4, Rio represents a hydrocarbon group having 1–10 carbon atoms, halogenated hydrocarbon group having 1–10 carbon atoms, tetrahydrofuranyl group, tetrahydropyranyl group, carbobutoxymethyl group, carbobutoxyethyl group, carbobutoxypropyl group, or trialkylsilyl group (wherein the alkyl group has a carbon atom content of 1–4), and $R^{11}$ denotes a hydrocarbon group having 1–10 carbon atoms or halogenated hydrocarbon group having 1–10 carbon atoms; or a heterocyclic structure containing oxygen or nitrogen atom wherein X and Y together bond with carbon atoms in the alicyclic structure to form a structure of the following formula:

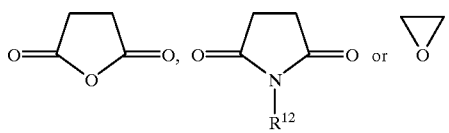

wherein $R^{12}$ is a hydrogen atom, halogen atom, alkyl group having 1–8 carbon atoms, or a group —$SO_2R^{13}$ (wherein $R^{13}$ is an alkyl group having 1–4 carbon atoms or a halogenated alkyl group having 1–4 carbon atoms).

The following groups can be given as examples of the group —$R^9COOR^{10}$ in the acid-cleavable group (ii): (cyclo) alkoxycarbonyl groups, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, n-pentyloxycarbonyl group, n-hexyloxycarbonyl group, n-heptyloxycarbonyl group, n-octyloxycarbonyl group, n-decyloxycarbonyl group; cycloalkoxycarbonyl groups such as cyclopentyloxycarbonyl group, cyclohexyloxycarbonyl group, 4-t-butylcyclohexyloxycarbonyl group, and cycloheptyloxycarbonyl group; aryloxycarbonyl groups such as phenoxycarbonyl group, 4-t-butylphenoxycarbonyl group, 1-naphthyloxycarbonyl group, aralkyloxycarbonyl group; aralkyloxycarbonyl groups such as benzyloxycarbonyl group and 4-t-butylbenzyloxy carbonyl group; (cyclo) alkoxycarbonylmethyl groups such as methoxycarbonylmethyl group, ethoxycarbonylmethyl group, n-propoxycarbonylmethyl group, iso-propoxycarbonylmethyl group, n-butoxycarbonylmethyl group, 2-methylpropoxycarbonylmethyl group, 1-methylpropoxycarbonylmethyl group, t-butoxycarbonylmethyl group, and cyclohexyloxycarbonylmethyl group, and 4-t-butylcyclohexyloxycarbonylmethyl group; aryloxycarbonylmethyl groups such as phenoxycarbonylmethyl group and 1-naphthyloxycarbonylmethyl group; aralkyloxycarbonylmethyl groups such as benzyloxycarbonylmethyl group and 4-t-butylbenzyloxycarbonylmethyl group; (cyclo) alkoxycarbonylethyl groups such as 2-methoxycarbonylethyl group, 2-ethoxycarbonylethyl group, 2-n-propoxycarbonylethyl group, 2-iso-propoxycarbonylethyl group, 2-n-butoxycarbonylethyl group, 2-(2-methypropoxy)carbonylethyl group, 2-(1-methylpropoxy)carbonylethyl group, 2-t-butoxycarbonylethyl group, 2-cyclohexyloxycarbonylethyl group, and 2-(4-butylcyclohexyloxycarbonyl)ethyl group; 2-aryloxycarbonylethyl group such as 2-phenoxycarbonylethyl group and 2-(1-naphthyloxycarbonyl)ethyl group; and 2-aralkyloxycarbonylethyl groups such as 2-benzyloxycarbonylethyl group and 2-(1-t-butylbenzyloxycarbonyl)ethyl group.

Given as examples of the group —$R^9OCOR^{11}$ are (cyclo) acyloxy groups such as acetyloxy group, propionyloxy group, butyryloxy group, valeryloxy group, caployloxy group, heptanoyloxy group, octanoyloxy group, nonanoyloxy group, decanoyloxy group, undecanoyloxy group, cyclohexylcarbonyloxy group, and 4-t-butylcyclohexylcarbonyloxy group; arylcarbonyloxy groups such as benzoyloxy group, 4-t-butylbenzoyloxy group, and 1-naphthoyloxy group; aralkylcarbonyloxy groups such as benzylcarbonyloxy group and 4-t-butylbenzylcarbonyloxy group; (cyclo)acyloxymethyl groups such as acetyloxycarbonylmethyl group, propionyloxycarbonylmethyl group, butyryloxycarbonylmethyl group, cyclohexylcarbonyloxymethyl group, and 4-t-butylcyclohexylcarbonyloxymethyl group; arylcarbonyloxymethyl groups such as benzoyloxymethyl group and 1-naphthoyloxymethyl group; aralkylcarbonyloxymethyl groups such as benzylcarbonyloxymethyl group and 4-t-butylbenzylcarbonyloxymethyl group; 2-(cyclo)acyloxyethyl groups such as 2-acetyloxyethyl group, 2-propionyloxyethyl group, 2-butyryloxyethyl group, 2-cyclohexylcarbonyloxyethyl group, and 2-(4-t-butylcyclohexylcarbonyloxy)ethyl group; 2-arylcarbonyloxyethyl group such as 2-benzoyloxyethyl group and 2-(1-naphthoyloxy)ethyl group; and 2-aralkylcarbonyloxyethyl groups such as 2-benzylcarbonyloxyethyl group and 2-(4-t-butylbenzylcarbonyloxy)ethyl group.

As examples of —$R^9CN$, cyano group, cyanomethyl group, 2-cyanoethyl group, 2-cyanopropyl group, 3-cyanopropyl group, and 4-cyanobutyl group can be given.

Among these acid-cleavable groups (ii), preferred groups are those represented by the formula —$R^9COOR^{10}$, and the groups represented by the formula —$COOR^{10}$, specifically, methoxycarbonyl group, t-butoxycarbonyl group, tetrahydropyranyloxycarbonyl group, and dicarboxy anhydride group, are ideal.

Describing the groups represented by A, B, X, or Y in the formula (2) or (3), F, Cl, Br, and I can be given as examples of halogen atoms. Givens as examples of the monovalent hydrocarbon group containing 1–10 carbon atoms are alkyl groups such as methyl group, ethyl group, n-propyl group, isopropyl group, n-butyl group, 2-methylpropyl group, 1-methylpropyl group, t-butyl group, n-hexyl group, n-octyl group, and n-decyl group; (cyclo)alkyl groups such as cyclopentyl group, cyclohexyl group, cycloheptyl group, and cyclooctyl group; aryl groups such as phenyl group, 4-t-butylphenyl group, 1-naphthyl group; and aralkyl groups such as benzyl group, and 4-t-butylbenzyl group. Halogenated derivatives of these monovalent hydrocarbon groups having 1–10 carbon atoms can be given as examples of the monovalent halogenated hydrocarbon groups containing 1–10 carbon atoms.

The resin (II) can be manufactured by any one of the following methods (d) to (h).

(d) A method of subjecting a norbornene derivative containing the acid-cleavable group (ii) corresponding to the recurring unit shown by the formula (2) or formula (3) (these derivatives are hereinafter collectively called "norbornene derivatives (a)"), optionally, together with other copolymerizable unsaturated alicyclic compounds, to ring-opening (co)polymerization.

(e) A method subjecting a norbornene derivative (α) and a copolymerizable unsaturated compound such as, ethylene, maleic anhydride, or the like, to a radical copolymerization reaction.

(f) A method of subjecting the resin obtained by the method (e) or (f) to partial hydrolysis and/or solvolysis according to a conventional manner.

(g) A method of introducing the acid-cleavable group (ii) into at least a part of the acidic functional groups in the resin obtained by the method (f) according to a conventional manner.

(h) A method of polymerizing acidic functional group-containing norbornene derivatives obtained by cleavage of the acid-cleavable group (ii) in the norbornene derivatives containing the acid-cleavable group (ii) corresponding to the recurring unit shown by the formula (2) or formula (3) (these acidic functional group-containing norbornene derivatives are hereinafter collectively called "norbornene derivatives (β)") to a ring-opening (co)polymerization or radical copolymerization, and introducing the acid-cleavable group (ii) into at least a part of the acidic functional groups of the resulting (co)polymer according to a conventional manner.

The following compounds are enumerated as examples of the norbornene derivatives (α):

5-methoxycarbonylbicyclo[2.2.1]hepto-2-ene,
5-ethoxycarbonylbicyclo[2.2.1]hepto-2-ene,
5-n-propoxycarbonylbicyclo[2.2.1]hepto-2-ene,
5-i-propoxycarbonylbicyclo[2.2.1]hepto-2-ene,
5-n-butoxycarbonylbicyclo[2.2.1]hepto-2-ene,
5-t-butoxycarbonylbicyclo[2.2.1]hepto-2-ene,
5-cyclohexyloxycarbonylbicyclo[2.2.1]hepto-2-ene,
5-(4'-t-butylcyclohexyloxy)carbonylbicyclo[2.2.1]hepto-2-ene,
5-phenoxycarbonylbicyclo[2.2.1]hepto-2-ene,
5-tetrahydrofuranyloxycarbonylbicyclo[2.2.1]hepto-2-ene,
5-tetrahydropyranyloxycarbonylbicyclo[2.2.1]hepto-2-ene,
5-acetyloxybicyclo[2.2.1]hepto-2-ene,
5-cyanobicyclo[2.2.1]hepto-2-ene,
5-methyl-5-methoxycarbonylbicyclo[2.2.1]hepto-2-ene,
5-methyl-5-ethoxycarbonylbicyclo[2.2.1]hepto-2-ene,
5-methyl-5-n-propoxycarbonylbicyclo[2.2.1]hepto-2-ene,
5-methyl-5-i-propoxycarbonylbicyclo[2.2.1]hepto-2-ene,
5-methyl-5-n-butoxycarbonylbicyclo[2.2.1]hepto-2-ene,
5-methyl-5-t-butoxycarbonylbicyclo[2,2.1]hepto-2-ene,
5-methyl-5-cyclohexyloxycarbonylbicyclo[2.2.1]hepto-2-ene,
5-methyl-5- (4-t-butylcyclohexyloxy)carbonylbicyclo [2.2.11]hepto-2-ene,
5-methyl-5-phenioxycarbonylbicyclo[2.2.1]hepto-2-ene,
5-methyl-5-tetrahydrofuranyloxycarbonylbicyclo[2.2.1] hepto-2-ene,
5-methyl-5-tetrahydropyranyloxycarbonylbicyclo[2.2.1] hepto-2-ene,
5,6-dicarboxyanhydridebicyclo[2.2.1]hepto-2-ene,
8-methoxycarbonyltetracyclo[4.4.0.1$^{2,5}$.1$^{7,10}$]dodeca-3-ene,
8-ethoxycarbonyltetracyclo[4.4.0.1$^{2,5}$.1$^{7,10}$]dodeca-3-ene,
8-n-propoxycarbonyltetracyclo[4.4.0.1$^{2,5}$.1$^{7,10}$]dodeca-3-ene,
8-i-propoxycarbonyltetracyclo[4.4.0.1$^{2,5}$.1$^{7,10}$]dodeca-3-ene,
8-n-butoxycarbonyltetracyclo[4.4.0.1$^{2,5}$.1$^{7,10}$ ]dodeca-3-ene,
8-t-butoxycarbonyltetracyclo[4.4.0.1$^{2,5}$.1$^{7,10}$]dodeca-3-ene,
8-cyclohexyloxycarbonyltetracyclo[4.4.0.1$^{2,5}$.1$^{7,10}$]dodeca-3-ene,
8-(4'-t-butylcyclohexyloxy)carbonyltetracyclo-[4.4.0.1$^{2,5}$.1$^{7,10}$]dodeca-3-ene,
8-phenoxycarbonyltetracyclo[4.4.0.1$^{2,5}$.1$^{7,10}$]dodeca-3-ene,
8-tetrahydrofuranyloxycarbonyltetracyclo[4.4.0.1$^{2,5}$.1$^{7,10}$]-3-dodecene,
8-tetrahydropyranyloxycarbonyltetracyclo[4.4.0.1$^{2,5}$.1$^{7,10}$]-3-dodecene,
8-methyl-8-methoxycarbonyltetracyclo[4.4.0.1$^{2,5}$.1$^{7,10}$] dodeca-3-ene,
8-methyl-8-ethoxycarbonyltetracyclo[4.4.0.1$^{2,5}$.1$^{7,10}$] dodeca-3-ene,
8-methyl-8-n-propoxycarbonyltetracyclo[4.4.0.1$^{2,5}$.1$^{7,10}$] dodeca-3-ene,
8-methyl-8-i-propoxycarbonyltetracyclo[4.4.0.1$^{2,5}$.1$^{7,10}$] dodeca-3-ene,
8-methyl-8-n-butoxycarbonyltetracyclo[4.4.0.1$^{2,5}$.1$^{7,10}$] dodeca-3-ene,
8-methyl-8-t-butoxycarbonyltetracyclo[4.4.0.1$^{2,5}$.1$^{7,10}$] dodeca-3-ene,
8-methyl-8-cyclohexyloxycarbonyltetracyclo[4.4.0.1$^{2,5}$.1$^{7,10}$]dodeca-3-ene,
8-methyl-8-(4'-t-butylcyclohexyloxy)carbonyltetracyclo [4.4.0.1$^{2,5}$.1$^{7,10}$]dodeca-3-ene,
8-methyl-8-phenoxycarbonyltetracyclo[4.4.0.1$^{2,5}$.1$^{7,10}$] dodeca-3-ene,
8-methyl-8-tetrahydrofuranyloxycarbonyltetracyclo [4.4.0.1$^{2,5}$.1$^{7,10}$]-3-dodecene,
8-methyl-8-tetrahydropyranyloxycarbonyltetracyclo [4.4.0.1$^{2,5}$.1$^{7,10}$]-3-dodecene, and
8,9-dicarboxyanhydridetetracyclo[4.4.0.1$^{2,5}$.1$^{7,10}$] dodeca-3-ene.

These norbornene derivatives (α) may be used either individually or in combinations of two or more.

The following compounds can be given as examples of the other unsaturation alicyclic compounds which can copolymerize with the norbornene derivatives (α) by ring-opening:

bicyclo[2.2.1]hepto-2-ene, bicyclo[2.2.1]hepto-2-ene-5-carboxylic acid, 5-methylbicyclo[2.2.1]hepto-2-ene-5-carboxylic acid, 5-methylbicyclo[2.2.1]hepto-2-ene, 5-ethylbicyclo[2.2.1]hepto-2-ene, tetracyclo[4.4.0.1$^{2,5}$.1$^{7,10}$]dodeca-3-ene, 8-methyltetracyclo[4.4.0.1$^{2,5}$.1$^{7,10}$] dodeca-3-ene, 8-ethyltetracyclo[4.4.0.1$^{2,5}$.1$^{7,10}$]dodeca-3-ene, tetracyclo[4.4.0.1$^{2,5}$.1$^{7,10}$]dodeca-3-ene-8-carboxylic acid, 8-methyltetracyclo[4.4.0.1$^{2,5}$.1$^{7,10}$] dodeca-3-ene-8-carboxylic acid, 8-fluorotetracyclo [4.4.0.1$^{2,5}$.1$^{7,10}$]dodeca-3-ene, 8-fluoromethyltetracyclo [4.4.0.1$^{2,5}$.1$^{7,10}$]dodeca-3-ene, 8-difluoromethyltetracyclo[4.4.0.1$^{2,5}$.1$^{7,10}$]dodeca-3-ene, 8-trifluoromethyltetracyclo[4.4.0.1$^{2,5}$.1$^{7,10}$]dodeca-3-ene, 8-pentafluoroethyltetracyclo[4.4.0.1$^{2,5}$.1$^{7,10}$ ]dodeca-3-ene, 8,8-difluorotetracyclo[4.4.0.1$^{2,5}$.1$^{7,10}$]dodeca-3-ene, 8,9-difluorotetracyclo[4.4.0.1$^{2,5}$.1$^{7,10}$]dodeca-3-ene, 8,8-bis(trifluoromethyl)tetracyclo[4.4.0.1$^{2,5}$.1$^{7,10}$]dodeca-3-ene, 8,9-bis(trifluoromethyl)tetracyclo[4.4.0.1$^{2,5}$.1$^{7,10}$]-dodeca-3-ene, 8-methyl-8-trifluoromethyltetracyclo-[4.4.0.1$^{2,5}$.1$^{7,10}$]dodeca-3-ene, 8,8,9-trifluorotetracyclo-[4.4.0.1$^{2,5}$.1$^{7,10}$]dodeca-3-ene, 8,8,9-tris (trifluoromethyl)-tetracyclo[4.4.0.1$^{2,5}$.1$^{7,10}$]-dodeca-3-ene, 8,8,9,9-tetrafluorotetracyclo[4.4.0.1$^{2,5}$.1$^{7,10}$]dodeca-3-ene, 8,8,9,9-tetrakis(trifluoromethyl)tetracyclo [4.4.0.1$^{2,5}$.1$^{7,10}$]dodeca-3-ene, 8,8-difluoro-9,9-bis (trifluoromethyl)tetracyclo-[4.4.0.1$^{2,5}$.1$^{7,10}$]dodeca-3-ene, 8,9-difluoro-8,9-bis-(trifluoromethyl)tetracyclo [4.4.0.1$^{2,5}$.1$^{7,10}$]dodeca-3-ene, 8,8,9-trifluoro-9-trifluoromethyltetracyclo-[4.4.0.1$^{2,5}$.1$^{7,10}$]dodeca-3-ene, 8,8,9-trifluoro-9-trifluoromethoxytetracyclo-[4.4.0.1$^{2,5}$.1$^{7,10}$] dodeca-3-ene, 8,8,9-trifluoro-8-pentafluoropropoxytetracyclo-[4.4.0.1$^{2,5}$.1$^{7,10}$]dodeca-3-ene, 8-fluoro-8-penta fluoroethyl-9,9-bis(trifluoromethyl) tetracyclo[4.4.0.1$^{2,5}$.1$^{7,10}$]dodeca-3-ene, 8,9-difluoro-8-heptafluoroisopropyl-9-trifluoromethyltetracyclo [4.4.0.1$^{2,5}$.1$^{7,10}$]dodeca-3-ene, 8-chloro-8,9,9-trifluorotetracyclo[4.4.0.1$^{2,5}$.1$^{7,10}$]dodeca-3-ene, 8,9-dichloro-8,9-bis(trifluoromethyl)tetracyclo-[4.4.0.1$^{2,5}$.1$^{7,10}$]dodeca-3-ene, 8-(2,2,2-trifluorocarboxyethyltetracyclo[4.4.0.1$^{2,5}$.1$^{7,10}$]dodeca-3-ene, 8,9-dichloro-8,9-bis(trifluoromethyl)tetracyclo[4.4.0.1$^{2,5}$.1$^{7,10}$]dodeca-3 -ene, 8-(2,2,2-trifluorocarboxyethyl) tetracyclo-[4.4.0.1$^{2,5}$.1$^{7,10}$]dodeca-3-ene, tetrakis-8-methyl-8-(2,2,2-trifluorocarboxyethyl)-tetracyclo [4.4.0.1$^{2,5}$.1$^{7,10}$]dodeca-3-ene, cyclobutene, cyclopentene, cyclooctene, 1,5-cyclooctadiene, 1,5,9-cyclododecatriene, norbornene, 5-ethylidenenorbornene, 5-methylnorbornene, dicyclopentadiene, tricyclo[5.2.1.0$^{2,6}$]detective-8-ene, tricyclo[5.2.1.0$^{2,6}$] detective-3-ene, tricyclo[4.4.0.1$^{2,5}$]undeca-9-ene, tricyclo[6.2.1.0$^{1,8}$]undeca-9-ene, tricyclo[6.2.1.0$^{1,8}$]undeca-4-ene, tetracyclo[4.4.0.1$^{2,5}$.1$^{7,1}$0.0$^{1,6}$]dodeca-3-ene, 8-methyltetracyclo[4.4.0.1$^{2,5}$.1$^{7,1}$0.0$^{1,6}$]dodeca-3-ene, 8-ethylidenetetracyclo[4.4.0.1$^{2,5}$.1$^{7,12}$]dodeca-3-ene, 8-ethylidenetetracyclo[4.4.0.1$^{2,5}$.1$^{7,1}$0.0$^{1,6}$]dodeca-3-ene, pentacyclo[6.5.1.1$^{3,6}$.0$^{2,7}$.0$^{9,13}$]pentadetective-4-ene, and pentacyclo[7.4.0.1$^{2,5}$.1$^{9,12}$2.0$^{8,13}$]pentadeca-3-ene.

These other unsaturated alicyclic compound may be used either individually or in combinations of two or more.

The content of the recurring units originating from these other unsaturated alicyclic compounds in the resin (II) is usually 50 mol % or less, preferably 30 mol % or less, and more preferably 30 mol % or less, in all recurring units in the resin (II).

As norbornene derivatives (β), the compounds with the ester group in the above-described norbornene derivatives (α) converted into a carboxyl group can be given.

The ring-opening (co) polymerization in the above method (d) can be carried out, for example, using a metathesis catalyst and, as required, an activation agent (for example, a boron compound, silicon compound, alcohol, or water) in the presence of a molecular weight modifier (for example, α-olefins, α,ω-diolefins, vinyl aromatic compounds) in an appropriate solvent.

The metathesis catalyst used here comprises the combination of at least one compound selected from tungsten compounds, molybdenum compounds, and rhenium compounds (hereinafter referred to as "specific transition metal compounds") and at least one compound of a metal selected from IA, IIA, IIIA, IVA, or IVB in Deming's Periodic Table and having a metal-carbon bond or a metal-hydrogen bond in the molecule (hereinafter referred to as "specific organometallic compound").

Given as examples of the specific transition metal compounds are WCl$_6$, WCl$_5$, WCl$_6$, WCl$_4$, WBr$_6$, WF$_6$, WI$_6$, MoCl$_5$, MoCl$_4$, MoCl$_3$, ReOCl$_3$, WOCl$_4$, WOCl$_3$, WOBr$_3$, MoOCl$_3$, MoOBr$_3$, ReOCl3, ReOBr$_3$, WCl$_2$ (OC$_2$H$_5$)$_4$, W(OC$_2$H$_5$)$_6$, MOCl$_3$(OC$_2$H$_5$)$_2$, Mo(OC$_2$H$_5$)$_5$, WO$_2$(acac)$_2$ (wherein acac represents an acetylacetonate residue), MoO$_2$ (acac)$_2$, W(OCOR)$_5$ (wherein OCOR stands for a carboxylic acid residue), Mo(OCOR) $_5$, W(CO)$_6$, Mo(CO)$_6$, Re$_2$(CO)$_{10}$, WCl$_5$·P(C$_6$H$_5$)$_3$, MoCl$_5$·P(C$_6$H$_5$)$_3$, ReOBr$_3$·P(C$_6$H$_5$)$_3$, WCl$_6$·NC$_5$H$_5$, W(CO)$_5$·P (C$_6$H$_5$)$_3$, and W(CO)$_3$·(CH$_3$CN)$_3$.

These specific transition metal compounds may be used either individually or in combinations of two or more.

Given as examples of the specific organometallic compounds are n-C$_4$H$_9$Li, n-C$_5$H$_{11}$Na, C$_6$H$_5$Na, CH$_3$MgI, C$_2$H$_5$MgBr, CH$_3$MgBr, n-C$_3$H$_7$MgCl, t-C$_4$H$_9$MgCl, CH$_2$=CHCH$_2$MgCl, (C$_2$H$_5$)$_2$Zn, (C$_2$H$_5$)$_2$Cd, CaZn(C$_2$H$_5$)$_4$, (CH$_3$)$_3$B, (C$_2$H$_5$)$_3$B, (n-C$_4$H$_9$)$_3$B, (CH$_3$)$_3$Al, (CH$_3$)$_2$AlCl, CH$_3$AlCl$^2$, (CH$_3$)$_3$Al$_2$Cl$_3$, (C$_2$H$_5$)$_3$Al, (C$_2$H$_5$)$_3$Al$_2$Cl$_3$, (C$_2$H$_5$)$_2$Al·O(C$_2$H$_5$)$_2$, (C$_2$H$_5$)$_2$AlCl, C$_2$H$_5$AlCl$_2$, (C$_2$H$_5$)$_2$AlH, (C$_2$H$_5$)$_2$AlOC$_2$H$_5$, (C$_2$H$_5$)$_2$AlCN, LiAl(C$_2$H$_5$)$_2$, (n-C$_3$H$_7$)$_3$Al, (i-C$_4$H$_9$)$_3$Al, (i-C$_4$H$_9$)$_2$AlH, (n-C$_6$H$_{13}$)$_3$Al, (n-C$_8$H$_{17}$)$_3$Al, (C$_6$H$_5$)$_3$Al, (CH$_3$)$_4$Ga, (CH$_3$)$_4$Sn, (n-C$_4$H$_9$)$_4$Sn, (C$_2$H$_5$)$_3$SnH, LiH, NaH, B$_2$H$_6$, NaBH$_4$, AlH$_3$, —LiAlH$_4$, and TiH$_4$.

These specific organometallic compounds may be used either individually or in combinations of two or more.

The radical copolymerization in the above method (e) can be carried out using a radical polymerization catalyst such as, for example, a hydroperoxide, dialkylperoxide, diacylperoxide, or azo compound, in a suitable solvent.

The ring-opening (co)polymerization or radical copolymerization in the above method (h) can be also carried out according to the same manner as in the above methods (d) or (e).

For ensuring transparency to radiation, a resin containing only a minimal amount of carbon-carbon unsaturated bonds is desirable as the resin (II). Such a resin can be obtained by effecting a hydrogenation reaction, hydration reaction, halogenation reaction, halogenation-hydrogenation reaction at any appropriate step in the ring-opening (co)polymerization according to the above method (d) or (f) or following the completion of the method (d) or (f). A resin obtained by effecting a hydrogenation reaction is particularly preferred as the resin (II). The resin obtained by the radiacal (co) polymerization according to the above method (e) or (h) does not substantially contain a carbon-carbon unsaturated bond.

The degree of the hydrogenation in the hydrogenated resin (II) obtained in this manner is 70% or more, preferably 90% or more, and particularly preferably 100% or more.

The polystyrene reduced weight molecular weight (hereinafter abbreviated as "Mw") of the acid-cleavable group-containing resin measured by gel permeation chromatography is usually from 1,000 to 300,000, preferably from 3,00 to 200,000, particularly preferably from 5,000 to 100,000.

The acid-cleavable group-containing resin may be used either individually or in combinations of two or more in the positive tone radiation sensitive resin composition of the present invention.

The acid-cleavable group-containing resin has characteristics of controlling the alkali solubility of the alkali-soluble resin. Specifically, the resin decomposes in the presence of an acid to decrease or kill, or accelerate the effect of controlling alkali solubility of the alkali-soluble resin. In this respect the acid-cleavable group-containing resin falls under the definition of the alkali solubility control agent of the component (B2) of the positive tone radiation sensitive resin composition of the present invention.

The following resin (II-1), resin (II-2), and resin (II-3) are particularly desirable as the resin (II).

Specifically, the resin (II-1) is a resin containing the recurring unit shown by the following formula (4):

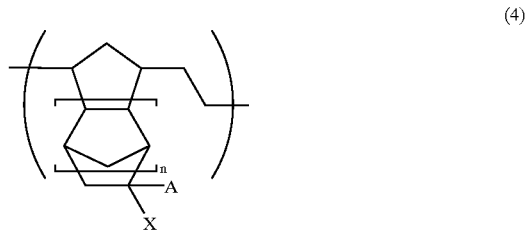

(4)

wherein n and A are the same as defined for the formulas (2) and (3), and X represents an acid-cleavable group.

The resin (II-2) is a random copolymer containing the recurring unit shown by the above formula (4) and the recurring unit shown by the following formula (5):

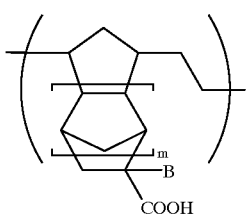

wherein B is the same as defined for the formulas (2) and (3), and m is 0 or 1.

The molar ratio of the recurring units of the formulas (4) and (5) in the resin (II-2) is usually 20:80 to 95:5, and preferably 30:70 to 90:10.

The resin (II-3) is a random copolymer containing the recurring unit shown by the following formula (6) and, optionally, the recurring unit shown by the following formula (7):

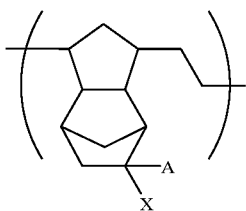

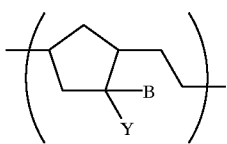

wherein A, B, X, and Y are respectively the same as defined for the formulas (2) and (3).

The molar ratio of the recurring units of the formulas (6) and (7) in the resin (II-3) is usually 5:95 to 100:0, and preferably 10:90 to 90:10.

Alkali-soluble resin

The alkali-soluble resin used in the positive tone radiation sensitive resin composition as the component (B2) and in the negative tone radiation sensitive resin composition is a resin soluble in an alkaline developing solution. This resin contains at least one acidic functional group which exhibits affinity to the alkaline developing solution, such as a phenolic hydroxyl group, naphtholic hydroxyl group, or carboxyl group. The addition polymerization resins or polycondensation resins given as the above resin (I) or the resins in which the acid-cleavable groups have cleaved given as the above resin (II) are included as examples of such an alkali-soluble resin,can be given.

Although the Mw of the alkali-soluble resin varies according to the characteristics desired for the radiation sensitive resin composition, the Mw in the range of 1,000–150,000, preferably 3,000–100,000, is applicable.

The alkali-soluble resin containing carbon-carbon unsaturated bonds can be used after hydrogenation. The degree of hydrogenation is usually 70% or less, preferably 50% or less, and more preferably 40% or less. If the degree of hydrogenation exceeds 70%, developing performance of the alkali-soluble resin using an alkaline developing solution may decrease. The alkali-soluble resins may be used either individually or in combinations of two or more in the positive tone or negative tone radiation sensitive resin compositions of the present invention. In addition, the alkali-soluble resin may also be used when an acid-cleavable group-containing resin is used the positive tone radiation sensitive resin composition.

Alkali solubility control agent

The compounds containing an acidic functional group, such as a phenolic hydroxyl group or carboxyl group, with at least one substitution group which can be cleaved in the presence of an acid (hereinafter called "acid-cleavable substituent") introduced therein can be given as the alkali solubility control agent used as the component (B2) in the positive tone radiation sensitive resin composition.

The same acid-cleavable groups (i) previously given for the resin (I), such as substituted methyl groups, 1-substituted ethyl groups, silyl groups, 1-branched alkyl groups, germyl groups, alkoxycarbonyl groups, acyl groups, and cyclic acid-cleavable groups, are given as examples of such acid cleavable groups.

The alkali solubility control agent may be either a high molecular compound or a low molecular compound. The compounds of the following formulas (8)–(12) are given as specific examples of the low molecular compound.

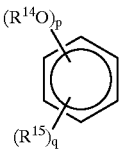

wherein $R^{14}$ indicates a substituted methyl group, 1-substituted ethyl group, 1-branched alkyl group, silyl group, germyl group, alkoxycarbonyl group, acyl group, or cyclic acid-cleavable group, with aplurality of $R^{14}$ s being either the same or different from each other, $R^{15}$ indicates an alkyl group containing 1–4 carbon atoms, a phenyl group, or 1-naphthyl group, with a plurality of $R^{15}$ s being either the same or different from each other, p is an integer of 1 or more and q is an integer of 0 or more, provided that P+q≦6.

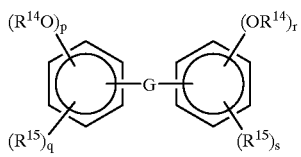

wherein $R^{14}$ and $R^{15}$ are the same as defined in the formula (8) and G represents a single bond, —S—, —O—, —Co—, —COO—, —So—, —S02—, —C(R16) (R17)— (wherein R16 and R17 maybe either the same or different and each individually represents a hydrogen atom, alkyl group having 1–6 carbon atoms, acyl group having 2–11 carbon atoms, phenyl group, or naphthyl group), or a group,

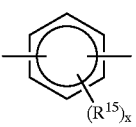

(wherein $R^{15}$ is the same as defined above and x is an integer of 0–4), p, q, r and s are respectively an integer of 0 or more, provided that p+q≦5, r+s≦5, and p+r≧1.

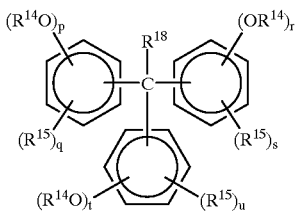

(10)

wherein $R^{14}$ and $R^{15}$ are the same as defined in the formula (8), $R^{18}$ indicates a hydrogen atom, alkyl group having 1–4 carbon atoms, or phenyl group, and p, q, r, s, t and u are respectively an integer of 0 or more, provided that $p+q \leq 5$, $r+s \leq 5$, and $t+u \leq 5$, $p+r+t \geq 1$.

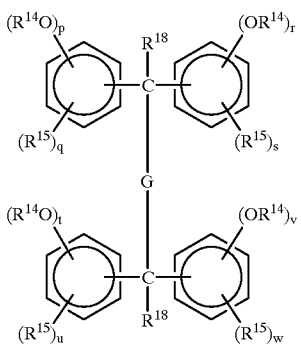

(11)

wherein $R^{14}$ and $R^{15}$ are the same as defined in the formula (8), G is the same as defined in the formula (9), $R^{18}$ is the same as defined in the formula (10), with a plurality of $R^{18}$ is being either the same or different from each other, and p, q, r, s, t, u, v and w are respectively an integer of 0 or more, proveded $p+q \leq 5$, $r+s > 5$, $t+u \leq 5$, $v+w \leq 5$, and $p+r+t+v \geq 1$.

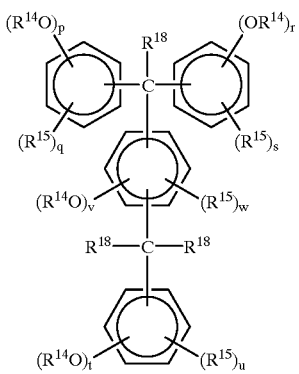

(12)

wherein $R^{14}$ and $R^{15}$ are the same as defined in the formula (8), $R^{18}$ is the same as defined in the formula (10), with a plurality of $R^{18}$ is being either the same or different from each other, and p, q, r, s, t, u, v and w are respectively an integer of 0 or more, proveded $p+q<5$, $r+s \leq 5$, $t+u \leq 5$, $v+w \leq 5$, and $p+r+t+v \leq 1$.

As the high molecular weight alkali solubility control agent, the above-described acid-cleavable group-containing resins can be used, for example.

In the positive tone radiation sensitive resin composition, either the low molecular compounds or the high molecular weight compounds (i.e. the acid-cleavable group-containing resins) may be used individually or in combinations of two or more as the alkali solubility control agent. A combination of a low molecular compound and a high molecular weight compound is also acceptable.

Crosslinking agents

The crosslinking agent used in the negative tone radiation sensitive resin composition of the present invention is a compound which can cause the alkali-soluble resin to cross-link in the presence of an acid, for example, an acid produced on being irradiated. As such a crosslinking agent, a compound having at least one substituted group exhibiting cross-linking reactivity with the alkali-soluble resin can be given, for example (such a substituted group is hereinafter called "cross-linking substituent").

The groups represented by the following formulas (13)–(17) can be given as examples of the cross-linking substituent in the crosslinking agent.

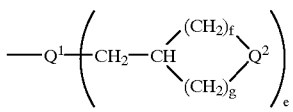

(13)

wherein e is an integer of 1 or 2; $Q^1$ represents a single bond, —O—, —S—, —COO—, or —NH—, when e=1, or a trivalent nitrogen atom when e=2, $Q^2$ indicates —O— or —S—, f an integer of 0–3, and g is an integer of 1–3, provided f+g=1–4.

(14)

wherein Q3 is a group —O—, —COO—, or —CO—, $R^{19}$ and $R^{20}$ individually represent a hydrogen atoms or alkyl group having 1–4 carbon 2. atoms, $R^{21}$ denotes an alkyl group with 1–5 carbon atoms, aryl group with 6–12 carbon atoms, or aralkyl group with 7–14 carbon atoms, and h is an integer of 1 or more.

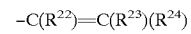

(15)

wherein R22, R23, and R24 individually represent a hydrogen atom or alkyl group with 1–4 carbon atoms.

(16)

wherein $R^{19}$ and $R^{20}$ are the same as defined in the formula (14), $R^{25}$ and $R^2$ individually represents an alkylol group having 1–5 carbon atoms and h is an integer of 1 or more.

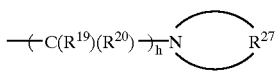

(17)

wherein $R^{19}$ and $R^{20}$ are the same as defined in the formula (14), R27 is a 3–8 member divalent organic ring having containing a hetero atom selected from oxygen atom, sulphur atom, and nitrogen atom and d is an integer of 1 or more.

Specific examples of such cross-linking substituents include glycidyl ether group, glycidyl ester group, glycidylamino group, methoxymethyl group, ethoxymethyl group, benzyloxymethyl group, dimethylaminomethyl group, diethylaminomethyl group, dimethylolaminomethyl group, dimethylolaminomethyl group, morpholinomethyl group, acetoxymethyl group, benzoyloxymethyl group, formyl group, acetyl group, vinyl group, and iso-propenyl group.

Given as examples of the compound which possesses these cross-linking substituents are bisphenol A-type epoxy compounds, bisphenol F-type epoxy compounds, bisphenol S-type epoxy compounds, novolak resin-based epoxy compounds, resol resin-based epoxy compounds, polyethylene(hydroxystyrene) type epoxy compounds, methylol group-containing melamine compounds, methylol group-containing benzoquanamine compounds, methylol group-containing urea compounds, methylol group-containing phenol compounds, alkoxyalkyl group-containing melamine compounds, alkoxyalkyl group-containing benzoquanamine compoundd, alkoxyalkyl group-containing urea compounds, alkoxyalkyl group-containing phenol compounds, carboxymethyl group-containing melamine resins, carboxymethyl group-containing benzoquanamine resins, carboxymethyl group-containing urea resins, carboxymethyl group-containing phenol resins, carboxymethyl group-containing melamine compounds, carboxymethyl group-containing benzoquanamine compounds, carboxymethyl group-containing urea compounds, and carboxymethyl group-containing phenol compounds.

The compound obtained by introducing the cross-linking substitution group into the acidic functional group in the above-described alkali-soluble resin to provide the resin with characteristics as a crosslinking agent can also be suitably used. In this instance, the amount of the cross-linking functional groups to be introduced is varied according to the types of the introduced cross-linking functional groups and the types of the alkali-soluble resin. Usually, this amount is 5–60 mol % of the total amount of the acidic functional groups in the alkali-soluble resin, with a preferable range being 10–50 mol %. The range from 15 to 40 mol % is most appropriate.

The crosslinking agents can be used either individually or as a mixture of two or more of them in the negative tone radiation sensitive resin composition of the present invention.

The proportion of the above-described components in the positive tone radiation sensitive resin composition and the negative tone radiation sensitive resin composition of the present invention differs according to the characteristics desired for the resist. Preferable proportions are as follows.

First, in the positive tone radiation sensitive resin composition, the amount of the acid generator (A) is in the range usually of 0.1–20 parts by weight, preferably 0.5–15 parts by weight, and particularly preferably 0.7–7 parts by weight, per 100 parts by weight of the acid-cleavable group-containing resin or the alkali-soluble resin. If the amount of the acid generator (A) is less than 0.1 parts by weight, the sensitivity and resolution tend to be decreased; if more than 20 parts by weight, coatability of the resist is impaired and the pattern form tends to be deteriorated.

The amount of the alkali solubility control agent is usually 5–150 parts by weight, preferably 5–100 parts by weight, and particularly preferably 5–50 parts by weight, per 100 parts by weight of the alkali-soluble resin. If the amount of the alkali solubility control agent tends less than 5 parts by weight, the rate of residual coating tends to be decreased, leading to swelling of the patterns; if more than 150 part by weights, coating surface is easily cracked, giving rise to deterioration of coating strength.

Typical formulations of these components in the positive tone radiation sensitive resin composition of the present invention are as follows.

[1-1] Acid generator (A): 0.1–15 parts by weight, acid-cleavable group-containing resin: 100 parts by weight, or

[1-2] Acid generator (A): 0.1–20 part by weight, alkali-soluble resin: 100 parts by weight, alkali solubility control agent: 5–150 parts by weight, preferably,

[1-3] Acid generator (A) 0.5–12 parts by weight, acid-cleavable group-containing resin: 100 parts by weight, or

[1-4] Acid generator (A): 0.5–15 parts by weight, alkali-soluble resin: 100 parts by weight, alkali solubility control agent: 5–100 parts by weight, and more preferably,

[1-5] Acid generator (A): 0.7–7 partsby weight, acid-cleavable group-containing resin: 100 parts by weight, or

[1-6] Acid generator (A): 0.7–7 parts by weight, alkali-soluble resin: 100 parts by weight, alkali solubility control agent: 5–50 parts by weight.

Next, in the negative tone radiation sensitive resin composition, the proportion of the acid generator (A) is usually 0.1–20 parts by weight, preferably 0.5–15 parts by weight, particularly preferably 0.7–7 parts by weight, per 100 parts by weight of the alkali-soluble resin. The sensitivity and resolution tend to decrease if this amount of the acid generator (A) is less than 0.1 part by weight. If more than 20 parts by weight, coatability of resists and configuration of patterns tend to deteriorate.

The proportion of the crosslinking agent is usually 5–95 parts by weight, preferably 15–85 parts by weight, and particularly preferably 20–75 parts by weight, per 100 parts by weight of alkali-soluble resin. The proportion of crosslinking agent less than 5 parts by weight may result in reduction in the rate of residual coatings and induce winding or swelling of patterns; the proportion exceeding 95 parts by weight tends to impair developing performances.

Specific proportions of each component in the negative tone radiation sensitive resin composition are as follows:

[2-1] Acid generator (A): 0.1–20 parts by weight, alkali-soluble resin: 100 parts by weight, and crosslinking agent: 5–95 parts by weight, more preferably,

[2-2] Acid generator (A): 0.5–15 parts by weight, alkali-soluble resin: 100 parts by weight, and crosslinking agent: 15–85 parts by weight, and particularly preferably,

[2-3] Acid generator (A): 0.7–7 parts by weight, alkali-soluble resin: 100 parts by weight, and crosslinking agent: 20–75 parts by weight.

Furthermore, various additives such as functional compounds, surfactants, Lewis base additives, and the like may be optionally formulated in the positive tone radiation sensitive resin composition and the negative tone radiation sensitive resin composition.

The functional compounds are the compounds exhibiting the action of improving anti-dry etching performance and pattern configurations. The following compounds can be given as examples of such functional compounds: 1-adamantanol, 3-adamantanol, 1-adamantane methanol, 3-adamantane methanol, 1,3-diadamantanol, 1,3-adamantane dimethanol, 1-adamantanecarboxylic acid, 3-adamantanecarboxylic acid, 1, 3-adamantanedicarboxylic acid, 1-adamantaneacetic acid, 3-adamantaneacetic acid, 1,3-adamantanediacetic acid, 3-methyl-2-norbornane methanol, myrtenol, camphor acid, cis-bicyclo[3.3.0] octane-2-carboxylicacid, 2-hydroxy-3-pinanone, camphanic acid, 3-hydroxy-4,7,7-trimethylbicyclo[2.2.1]heptane-2-acetic acid, 1,5-decalindiol, 4,8-bis(hydroxy)tricyclo [5.2.1.0$^{2,6}$]decane, borneol, 1-noradamantanecarboxylic acid, 3-noradamantanecarboxylic acid, 2-norbornaneacetic acid, 1,3-norbornanediol, 2,3-norbornanediol, 2,5-norbornanediol, 2,6-norbornanediol, 4-pentylbicyclo[2.2.2] octane-1-carboxylic acid, pinanediol, 1-naphthalene methanol, 2-naphthalene methanol, 1-naphthol, 2-naphthol, 1-naphthalenecarboxylic acid, 2-naphthalenecarboxylic acid, (1-naphthoxy)acetic acid, (2-naphthoxy)acetic acid, 1-naphthylacetic acid, 2-naphthylacetic acid, 1,2-naphthalene dimethanol, 1,3-naphthalene dimethanol, 1,4-naphthalene dimethanol, 1,5-naphthalene dimethanol, 1,6-naphthalene dimethanol, 1,7-naphthalene dimethanol, 1,8-naphthalene dimethanol, 2,3-naphthalene dimethanol, 2,8-naphthalene dimethanol, 2,7-naphthalene dimethanol, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,6-dihydroxynaphthalene, 2,7-dihydroxynaphthalene, (1,8-naphthoxy)diacetic acid, (1,3-naphthoxy)diacetic acid, (1,4-naphthoxy)diacetic acid, (1,5-naphthoxy)diacetic acid, (1,6-naphthoxy)diacetic acid, (1,7-naphthoxy)diacetic acid, (1,8-naphthoxy)diacetic acid, (2,3-naphthoxy)diacetic acid, (2,6-naphthoxy)diacetic acid, (2,7-naphthoxy)diacetic acid, 1,2-naphthalenedicarboxylic acid, 1,3-naphthalenedicarboxylic acid, 1,4-naphthalenedicarboxylic acid, 1,5-naphthalenedicarboxylic acid, 1,6-naphthalenedicarboxylic acid, 1,7-naphthalenedicarboxylic acid, 1,8-naphthalenedicarboxylic acid, 2,3-naphthalenedicarboxylic acid, 2,6-naphthalenedicarboxylic acid, 2,7-naphthalenedicarboxylic acid, 1,2-naphthyldiacetic acid, 1,3-naphthyldiacetic acid, 1,4-naphthyldiacetic acid, 1,5-naphthyldiacetic acid, 1,6-naphthyldiacetic acid, 1,7-naphthyldiacetic acid, 1,8-naphthyldiacetic acid, 2,3-naphthyldiacetic acid, 2,6-naphthyldiacetic acid, 2,7-naphthyldiacetic acid, 3-hydroxy-1,8-dicarboxynaphthalene, 1-hydroxy-2-carboxynaphthalene, 3-hydroxy-2-carboxynaphthalene, 4-hydroxy-2-carboxynaphthalene, 5-hydroxy-2-carboxynaphthalene, 6-hydroxy-2-carboxynaphthalene, 7-hydroxy-2-carboxynaphthalene, 8-hydroxy-2-carboxynaphthalene, 2-hydroxy-1-carboxynaphthalene, 3-hydroxy-1-carboxynaphthalene, 4-hydroxy-1-carboxynaphthalene, 5-hydroxy-1-carboxynaphthalene, 6-hydroxy-1-carboxynaphthalene, 7-hydroxy-1-carboxynaphthalene, 8-hydroxy-1-carboxynaphthalene, 1-carboxy2-naphthoxyacetic acid, 3-carboxy-2-naphthoxyacetic acid, 4-carboxy-2-naphthoxyacetic acid, 5-carboxy-2-naphthoxyacetic acid, 6-carboxy-2-naphthoxyae tic acid, 7-carboxy-2-naphthoxyacetic acid, 8-carboxy-2-naphthoxyacetic acid, 2-carboxy-1-naphthoxyacetic acid, 3-carboxy-1-naphthoxyacetic acid, 4- carboxy-1-naphthoxyacetic acid, 5-carboxy-1-naphthoxyacetic acid, 6-carboxy-1-naphthoxyacetic acid, 7-carboxy-1-naphthoxyacetic acid, 8-carboxy-1-naphthoxyacetic acid, and the compounds derived by substituting the hydrogen atom in the carboxyl group or hydroxyl group in these compounds with an acid-cleavable group. Here, as the acid-cleavable group, the same groups which are given as the examples of acid-cleavable groups (i) and (ii) in the above description of the acid-cleavable group-containing resin can be given.

These functional compounds may be used either individually or in combinations of two or more.

The amount of the functional compounds to be formulated is usually 50 parts by weight or less per 100 parts by weight of the acid-cleavable group-containing resin or alkali-soluble resin.

The surfactants improve coatability and promote developing performances of the radiation sensitive resin composition.

Given as examples of the surfactants used on the present invention are nonionic surfactants, such as polyoxyethylene -lauryl ether, polyoxyethylene stearyl ether, polyoxyethylene oleyl ether, polyoxyethylene octylphenyl ether, polyoxyethylene nonylphenyl ether, polyethylene glycol dilaurate, and polyethylene glycol distearate, and products commercially available under the trademarks, such as KP341™ (manufactured by Sin-Etsu Chemical Co., Ltd.), Polyflow™ No. 75 and No. 95 (manufactured by Kyoei Oil and Fat Chemical Co., Ltd.), Efftops™ EF301, EF303, EF352 (manufactured by Tokem Products), Megafacks™ F171, F173 (manufactured by Dainippon Ink and Chemicals Co., Ltd.), Florades™ FC430, FC431 (manufactured by Sumitomo 3M Co., Ltd.), Asahi Guard™ AG710 (manufactured by Asahi Glass Co., Ltd.), and Surflon™ S-382, SC-101, SC-102, SC-103, SC-104, and SC-105 (manufactured by Asahi Glass Co., Ltd.).

These surfactants may be used either individually or in combinations of two or more.

The amount of the surfactants to be incorporated is normally less than 2 parts by weight for 100 parts by weight of the radiation sensitive resin composition.

The Lewis base additive is the compound exhibiting an action as a Lewis base to the acid produced from the acid generators (A) and/or the other acid generators. Addition of the Lewis base additive improves perpendicularity of resist pattern side walls more effectively.

Nitrogen-containing basic compounds, salts thereof, carboxylic acids, alcohols, and the like can be given as examples of such Lewis base additives, with nitrogen-containing basic compounds being desirable.

Given as specific examples of the nitrogen-containing basic compounds are amine compounds such as triethylamine, tri-n-propylamine, tri-isopropylamine, tri-n-butylamine, tri-n-hexylamine, triethanolamine, triphenylamine, aniline, N,N-dimethylaniline, 2-methylaniline, 3-methylaniline, 4-methylaniline, 4-nitroaniline, 1-naphthylamine, 2-naphthylamine, diphenylamine, ethylenediamine, tetramethylenediamine, hexamethylenediamine, and pyrrolidine, piperidine; imidazole compounds such as imidazole, 4-methylimidazole, 4-methyl-2-phenylimidazole, thiabendazole, and benzimidazole; pyridine compounds such as pyridine, 2-methylpyridine, 4-ethylpyridine, 2-hydroxypyridine, 4-hydroxypyridine, 2-phenylpyridine, 4-phenylpyridine, nicotinic acid, nicotinic acid amide, quinoline, and acridine; and other nitrogen-containing heterocyclic compounds such as purine, 1,3,5-triazine, triphenyl-1,3,5-triazine, 1,2,3-triazole, 1,2,4-triazole, and urazol.

These nitrogen-containing basic compounds may be used either individually or in combinations of two or more.

The amount of the Lewis base additives used is usually 1 mol or less, preferably 0.05–1 mol, for 1 mol of the acid generator (A). If the amount of the Lewis base additives exceeds 1 mol, the sensitivity as the resist tends to be decreased.

Other additives which can be used in the radiation sensitive resin composition of the present invention include halation preventives, adhesion assistant agents, storage stabilizers, anti-foaming agents, and the like. Preparation of composition solution The positive-tone radiation sensitive resin composition and the negative-tone radiation sensitive resin composition of the present invention are prepared into a solution when used, by dissolving these in a solvent to make a solid concentration of 5–50 wt %, and filtering through a filter with a pore size of 0.2 µm, for example.

Given as examples of the solvent used for preparing such a composition solution are n-propyl alcohol, isopropyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, propylene glycol monomethyl ether acetate, propylene glycol monoethyl ether acetate, propylene glycol mono-n-propyl ether acetate, toluene, xylene, methyl ethyl ketone, methyl n-propyl ketone, isopropyl ketone, methyl n-butyl ketone, methyl isobutyl ketone, 2-heptanone, 3-heptanone, 4-heptanone, cyclopentanone, cyclohexanone, methyl 2-hydroxypropionate, ethyl 2-hydroxypropionate, ethyl 2-hydroxy-2-methylpropionate, ethoxyethyl acetate, hydroxyethyl acetate, methyl 2-hydroxy-3-methyl butyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl 3-methoxypropionatet, ethyl 3-ethoxypropionate, methyl pyruvate, ethyl pyruvate, N-methylpyrrolidone, N-N-dimethylformamide, N,N-dimethylacetamide, benzyl ethyl ether, dihexyl ether, diethylene glycol monomethyl ether, diethylene glycol monoethyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, and propylene carbonate.

These solvents may be used either individually or in combinations of two or more.

Forming resist pattern

To prepare a resist pattern from the positive-tone radiation sensitive resin composition or the negative-tone radiation sensitive resin composition of the present invention, the solution of the composition thus prepared is applied to a substrate such as a silicon wafer, aluminum-coated silicon wafer, to form a resist coating by rotational coating, cast coating, or roll coating. The resist coating is then pre-baked and irradiated to form a desired pattern through a mask pattern. Radiation used here is preferably near ultraviolet rays such as an i-line (wavelength: 365 nm), deep ultraviolet rays such as a bright line spectrum from a mercury lamp (wavelength: 254 nm), a KrFexcimer laser (wavelength: 248 nm), and an ArF excimer laser (wavelength: 193 nm), X-rays such as synchrotron radiation, or charged particle rays such as an electron beam.

In the preparation of patterns, after exposure to radiation the coatings are preferably heated (hereinafter called post-exposure bake). Although the heating conditions are varied according to the type of the resin composition and the kind of additives used, the resist is usually heated at 30–200° C., preferably 50–150° C.

Moreover, in order to draw the potential capacity of the radiation sensitive resin composition to the maximum, an organic or inorganic reflection preventive film can be formed the substrate in advance according to a method disclosed in Japanese Patent Publication No. 12452/1994, for example. Also, it is possible to provide a protective coat on the resist film to reduce the effect of basic impurities which may be present in the atmosphere according to a method disclosed, for example, in Japanese Patent Application Laid-open No. 188598/1993. Combined used of these techniques is also acceptable.

Then, the resist coating is developed with an alkaline developer for forming a prescribed pattern.

An alkaline solution in which one or more alkaline compound is dissolved is used as the alkaline developer. Given as examples of alkaline compounds which can be used here are sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethylamine, triethanolamine, tetramethylammonium hydroxide, pyrrole, piperidine, choline, 1,8-diazabicyclo-[5.4.0-7]-undecene, and 1,5-diazabicyclo-[4.3.0-5]-nonene. The concentration of the aqueous alkaline solution is usually 10 wt % or less. If more than 10 wt %, unexposed parts may also be dissolved in the developing solution.

Moreover, an organic solvent, for example, can be added to the developing solution consisting of the above-described alkaline aqueous solution.

Given as specific examples of such organic solvents are ketones, such as acetone, methyl ethyl ketone, methyl isobutyl ketone, cyclopentanone, cyclohexanone, 3-methyl-2-cyclopentanone, and 2,6-dimethylcyclohexanone; alcohols such as methyl alcohol, ethyl alcohol, n-propyl alcohol, isopropyl alcohol, n-bttyl alcohol, t-butyl alcohol, cyclopentanol, cyclohexanol, 1,4-hexanediol, and 1,4-hexanedimethylol; ethers such as tetrahydrofuran and dioxane; esters such as ethyl acetate, butyl acetate, and isoamyl acetate; aromatic hydrocarbons such as toluene and xylene; phenol, acetonyl acetone, and dimethylformamide.

These organic solvents may be used either individually or in combinations of two or more.

The amount of the organic solvents used is preferably 100 vol % or less of the amount of the alkaline aqueous solution. If the amount of the organic solvents used is more than 100 vol% of the amount of the alkaline aqueous solution, developing performance is impaired, so that there will be an increase in undeveloped areas among the irradiated parts.

A suitable amount of a surfactant and the like can be added to the developing solution which consists of an alkaline aqueous solution.

After development using the developing solution consisting of an alkaline aqueous solution, the resist is washed with water and dried.

Japanese Patent Application No. 353866/1996 is hereby incorporated by reference.

Other features of the invention will become apparent in the course of the following description of the exemplary embodiments which are given for illustration of the invention and are not intended to be limiting thereof.

EXAMPLES

In the examples and comparative examples below measurement of the Mw of polymers and evaluation of various characteristics of the resists were carried out according to the following methods.

Mw:

The Mw was measured by gel permeation chromatography (GPC) using a mono-dispersed polystyrene as a standard, wherein GPC columns (two G2000H$_{XL}$ columns, one G3000H$_{XL}$ column, and one G4000H$_{XL}$ column, all trademarks, manufactured by Tosoh Corp.) were used under the conditions of a flow rate of 1.0 ml/minute, a column temperature of 40° C., and using tetrahydrofuran as an eluant.

Sensitivity:

The optimum exposure sensitivity was determined taking the irradiation dose required for forming a pair of line-and-space patterns (1L1S) with a line width of 0.26 μm as an optimum dose.

Resolution:

The minimum size (>m) of resist pattern produced when exposed to light with an optimum exposure dose was taken as the resolution.

Pattern configuration:

The dimensions of the lower side (La) and upper side (Lb) of the square cross section of the 1L1S with a line width of 0.3 μm formed on a silicon wafer were measured using a scanning type electron microscope. Those satisfying an inequality, $0.85 \leq Lb/La \leq 1$, and having no bores, cuts, or scrapes are rated to be "Good" and those which do not satisfy any one of these requirements were judged to be "Bad".

Rate of residual coating:

The proportion (%) of resist coating thickness exposed to light at an optimum dose before development of the resist pattern to the thickness after development was taken as the rate of residual coating.

The components used in the following examples and comparative examples were as follows.

Positive-tone radiation sensitive resin composition

Acid Qenerators(A):

(A-1) 4-Hydroxy-1-naphthyltetrahydrothiophenium trifluoromethanesulfonate (A-2) 4-Methoxy-1-naphthyltetrahydrothiophenium trifluoromethanesulfonate (A-3) 4-n-Butoxy-1-naphthyltetrahydrothiophenium trifluoromethanesulfonate (A-4) 4-t-Butoxy-1-naphthyltetrahydrothiophenium trifluoromethanesulfonate (A-5) 4-n-Butoxy-1-naphthyltetrahydrothiophenium n-nonafluorobutanesulfonate Other acid generators:

(a-1) Triphenylsulfonium trifluoromethanesulfonate (a-2) (Bisphenylsulfonyl)methane Acid-cleavable group containing resins:

(B1-1) Resin with 26 mol % of hydrogen atoms of phenolic hydroxyl groups on poly(hydroxystyrene) replaced by t-butoxycarbonyl groups (Mw=9,000)

(B1-2) Resin with 20 mol % of hydrogen atoms of phenolic hydroxyl groups on poly(hydroxystyrene) replaced by t-butoxycarbonyl groups (Mw=25,000)

(B1-3) Resin with 32 mol % of hydrogen atoms of phenolic hydroxyl groups on poly(hydroxystyrene) replaced by 1-ethoxyethyl group (Mw=15,000)

(B1-4) Copolymer of hydroxy-α-methylstyrene and t-butylacrylate (copolymerization mol ratio=5:5, Mw=12,000)

(B1-5) Copolymer of tetrahydropyranyl acrylate, tricyclodecanyl acrylate, and 2-hydroxypropyl acrylate (copolymerization mol ratio=4:5:1, Mw=13,000)

(B1-6) Copolymer consisting of the recurring unit shown by the following formula (18-1) and the recurring unit shown by the following formula (18-2) (copolymerization mol ratio=20:80, Mw=25,000)

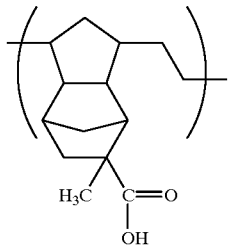

(18-1)

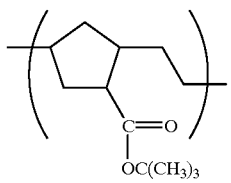

(18-2)

(B1-7) Copolymer consisting of the recurring unit shown by the following formula (19-1) and the recurring unit shown by the following formula (19-2) (copolymerization mol ratio=80:20, Mw=32,000)

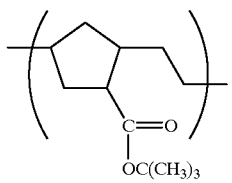

(19-1)

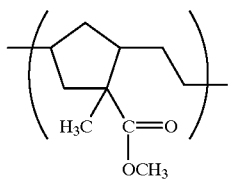

(19-2)

(B1-7) Copolymer consisting of the recurring unit shown by the following formula (20-1) and the recurring unit shown by the following formula (20-2) (copolymerization mol ratio=55:45, Mw=12,000)

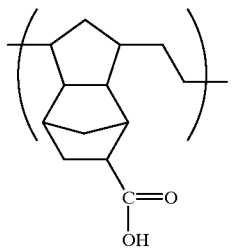

(20-1)

-continued (20-2)

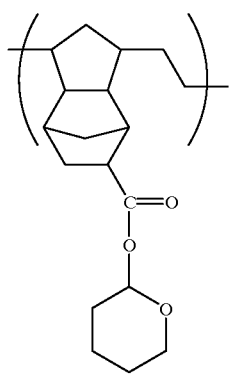

Alkali-soluble resin:
  (B2-1) Poly(p-hydroxystyrene) (Mw=7,500)
Alkali solubility control agents:
  (B2-2) The compound of the following formula (21)

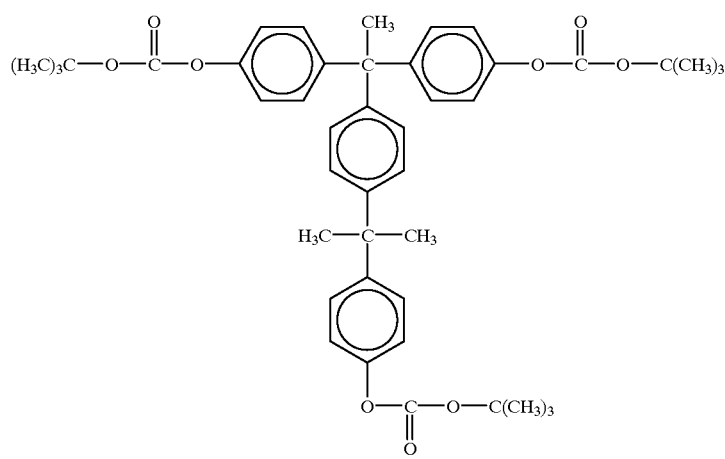

(21)

(B2-3) The compound of the following formula (22)

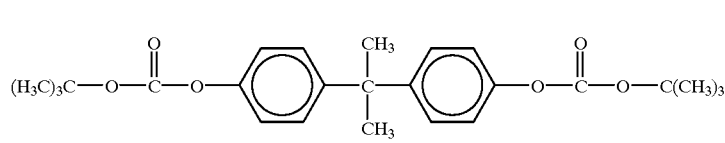

(22)

Other components:
  As Lewis base additives:
    (E-1) Tri-n-butylamine
    (E-2) Nicotinic acid amide
  As solvents:
    (S-1) Ethyl 2-hydroxypropionate
    (S-2) Propylene glycol monoethyl ether acetate
    (S-3) 2-Heptanone
    (S-4) Cyclohexanone
Negative tone radiation sensitive resin composition
Acid generators (A) and other acid generators:
  The same compounds as used for the positive tone radiation sensitive resin compositions were used.

Alkali-soluble resins:
  (C-1) Poly(p-hydroxystyrene) (Mw=7,500)
  (C-2) Copolymer of p-hydroxystyrene and styrene (copolymerization mol ratio =7: 3, Mw=7,000)
Crosslinking agents:
  (D-1) Dimethoxymethylurea (MX290™, manufactured by Sanwa Chemical Co., Ltd.)
  (D-2) Tetramethoxymethyl glycoloyl (CYMEL 1174™ manufactured by Mitsui Cyanamid Co.)
Other components:
  The same Lewis base additives and solvents as used for the positive tone radiation sensitive resin compositions were used.

Examples 1–13, Comparative Example 1

The components shown in Table 1 were mixed to produce homogeneous solutions. The solution was filtered through a membrane filter with a pore diameter 0.2 µm, thus obtaining composition solutions. The compositions in Examples 1–8 and Comparative Example 1 are positive tone type and the compositions in Examples 9–10 are negative tone type.

The composition solutions were applied to silicone wafers by role coating and prebaked for 5 minutes on a hot plate maintained at 100° C. to obtain resist films with a film thickness 1.1 µm. The resist films were irradiated through a mask pattern at different irradiation doses using a KrF excimer laser exposure machine (NSR-2005 EX8A™, a product of Nicon Co., Ltd.) for Examples 1–4, Example 8–10, and Comparative Example 1, and an ArF excimer laser exposure machine (lens aperture number=0.55, a product of Nicon Co., Ltd.) for Examples 5–13. Then, the resists were baked for 1 minute on a hot plate maintained at 110° C., developed for 1 minute at 25° C. in an aqueous solution of 2.38 wt % tetramethylammonium hydroxide, washed with water, and dried.

The results of evaluation are given in Table 2.

TABLE 1

| | Resin | | Crosslinking | Acid | Lewis base | |
|---|---|---|---|---|---|---|
| | B1 | Others | agent | generator | additive | Solvent |
| Example 1 | B1-1 (80) | B2-2 (20) | — | A-1 (2.5) | E-1 (0.01) | S-1 (340) |
| Example 2 | B1-2 (80) | B2-3 (20) | — | A-1 (1.5) a-1 (1.5) | E-1 (0.01) | S-2 (450) |
| Example 3 | B1-3 (100) | — | — | A-1 (2.0) a-2 (2.0) | E-1 (0.01) | S-2 (400) |
| Example 4 | B1-4 (50) | B2-1 (50) | — | A-1 (2.0) | E-1 (0.01) | S-1 (400) |
| Example 5 | B1-5 (100) | — | — | A-1 (3.0) | E-2 (0.02) | S-3 (450) |
| Example 6 | B1-6 (100) | — | — | A-1 (3.0) | E-1 (0.01) | S-3 (450) |
| Example 7 | B1-7 (100) | — | — | A-1 (3.0) | E-1 (0.02) | S-3 (450) |
| Example 8 | B1-8 (100) | — | — | A-1 (3.0) | E-1 (0.02) | S-3 (340) |
| Example 9 | C1 (100) | — | D-1 (25) | A-1 (3.5) | E-2 (0.2) | S-4 (400) |
| Example 10 | C2 (100) | — | D-2 (25) | A-1 (3.5) | E-2 (0.2) | S-1 (400) |
| Example 11 | B1-5 (100) | — | — | A-3 (1.5) | E-1 (0.02) | S-3 (400) |
| Example 12 | B1-5 (100) | — | — | A-4 (2.5) | E-1 (0.01) | S-1 (400) |
| Example 13 | B1-5 (100) | — | — | A-5 (2.0) | E-1 (0.02) | S-3 (340) |
| Comparative Example 1 | B1-1 (80) | — | — | a-1 (2.5) | E-1 (0.01) | S-1 (340) |

TABLE 2

| | Sensitivity (mJ/cm$^2$) | Resolution ($\mu$m) | Pattern configuration | Residual coating (%) |
|---|---|---|---|---|
| Example 1 | 20 | 0.26 | Good | 97 |
| Example 2 | 15 | 0.26 | Good | 96 |
| Example 3 | 20 | 0.26 | Good | 96 |
| Example 4 | 25 | 0.24 | Good | 98 |
| Example 5 | 28 | 0.18 | Good | 99 |
| Example 6 | 25 | 0.22 | Good | 99 |
| Example 7 | 18 | 0.22 | Good | 99 |
| Example 8 | 24 | 0.24 | Good | 99 |
| Example 9 | 22 | 0.24 | Good | 97 |
| Example 10 | 16 | 0.24 | Good | 97 |
| Example 11 | 20 | 0.18 | Good | 99 |
| Example 12 | 10 | 0.18 | Good | 99 |
| Example 13 | 20 | 0.18 | Good | 97 |
| Comparative Example 1 | 45 | 0.26 | Good | 97 |

Use of the specific salt as a photoacid generator ensures the positive tone radiation sensitive resin composition and negative tone radiation sensitive resin composition of the present invention to exhibit superior sensitivity, excellent resolution, capability of producing superb pattern configuration, and a reduced rate of residual coatings. These radiation sensitive resin compositions can effectively react by radiation such as near ultraviolet rays, deep ultraviolet rays, X-rays, or a charged particle line.

The positive tone and negative tone radiation sensitive resin compositions of the present invention is, therefore, very useful as a resist for producing semiconductors which are anticipated to be miniaturized in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A positive-tone radiation sensitive resin composition comprising:
   (A) a photoacid generator represented by the formula (1-1):

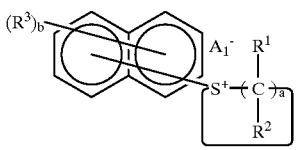

(1-1)

wherein $R^1$ and $R^2$ may be either the same or different and each individually represent a hydrogen atom, an alkyl group containing 1–4 carbon atoms, $R^3$ represents a hydroxyl group or —$OR^4$, $A_1^-$ indicates a monovalent anion originating from sulfonic acid, a denotes an integer of 4–7, and b is an integer of 0–7; wherein said —$OR^4$ is an alkoxy group selected from the group consisting of methoxy group, ethoxy group, n-propoxy group, i-propoxy group, n-butoxy group, i-butoxy group, sec-butoxy group, t-butoxy group, methoxymethoxy group, ethoxymethoxy group, n-propoxymethoxy group, i-propoxymethoxy group, 1-methoxyethoxy group, 1-ethoxyethoxy group, 1-n-propoxyethoxy group, 1-i-propoxyethoxy group, 2-methoxyethoxy group, 2-ethoxyethoxy group, 2-n-propoxyethoxy group, 2-i-propoxyethoxy group, 1-methoxypropoxy group, 2-methoxypropoxy group, 3-methoxypropoxy group, 1-ethoxypropoxy group, 2-ethoxypropoxy group, 3-ethoxypropoxy group, methoxycarbonyloxy group, ethoxycarbonyloxy group, n-propoxycarbonyloxy group, i-propoxycarbonyloxy group, n-butoxycarbonyloxy group, i-butoxycarbonyloxy group, sec-butoxycarbonyloxy group, 2-tetrahydrofuranyloxy group, 2-tetrahydropyranyloxy group, benzyloxy group, o-methylbenzyloxy group, m-methylbenzyloxy group, p-methylbenzyloxy group, p-t-butylbenzyloxy group, p-methoxybenzyloxy group, methoxycarbonylmethyl group, ethoxycarbonylmethyl group, n-propoxycarbonylmethyl group, i-propoxycarbonylmethyl group, n-butoxycarbonylmethyl group, i-butoxycarbonylmethyl group, sec-butoxycarbonylmethyl group and t-butoxycarbonylmethyl group:

(B1) an acid-cleavable group-containing resin which is insoluble or scarcely soluble in alkali, but becomes soluble in alkali when the acid-cleavable group is cleaved, or (B2) an alkali-soluble resin and an alkali solubility control agent.

2. The positive-tone radiation sensitive resin composition according to claim 1, wherein the acid-cleavable group-containing resin (BE) is a resin having a structure wherein a hydrogen atom in an acidic functional group is replaced by at least one acid-cleavable group or a resin containing an acid-cleavable group and having an alicyclic structure in the main chain.

3. The positive-tone radiation sensitive resin composition according to claim 2, wherein the acidic functional group is a phenolic hydroxyl group, naphtholic hydroxyl group, or carboxyl group.

4. The positive-tone radiation sensitive resin composition according to claim 2, wherein the acid-cleavable group is a substituted methyl group, 1-substituted ethyl group, 1-branched alkyl group, silyl group, germyl group, alkoxycarbonyl group, acyl group, or cyclic acid-cleavable group.

5. The positive-tone radiation sensitive resin composition according to claim 2, wherein the alicyclic structure in the resin having an alicyclic structure in the main chain is a monocyclic structure originating from a cycloalkane or a polycyclic structure originating from bicyclo[2.2.1]heptane or tetracyclo[$4.4.0.1^{2,5}.1^{7,10}$]dodecane.

6. The positive-tone radiation sensitive resin composition according to claim 1, wherein the alkali solubility control agent is a compound containing an acidic functional group wherein at least one substitution group which can be cleaved in the presence of an acid is introduced.

7. The positive-tone radiation sensitive resin composition according to claim 6, wherein the acidic functional group is a phenolic hydroxyl group or a carboxyl group.

8. The positive-tone radiation sensitive resin composition according to claim 6, wherein the substitution group which can be cleaved in the presence of an acid is a substituted methyl group, 1-substituted ethyl group, silyl group, 1-branched alkyl group, germyl group, alkoxycarbonyl group, acyl group, or cyclic acid-cleavable group.

9. The positive-tone radiation sensitive resin composition according to claim 1, further comprising a photoacid generator other than the photoacid generator represented by the formula (1-1), wherein such other photoacid generator is selected from the group consisting of onium salts, halogen-containing compounds, diazoketone compounds, sulfone compounds, and sulfonic acid compounds.

10. The positive-tone radiation sensitive resin composition according to claim 1 comprising 0.1–15 parts by weight of the photoacid generator (A) for 100 parts by weight of the acid-cleavable group-containing resin (B-1).

11. The positive-tone radiation sensitive resin composition according to claim 1 comprising 0.1–20 parts by weight of the photoacid generator (A) for 100 parts by weight of the alkali-soluble resin and 5–150 parts by weight of the alkali solubility control agent.

* * * * *